(12) United States Patent
Eroz et al.

(10) Patent No.: US 10,530,394 B2
(45) Date of Patent: Jan. 7, 2020

(54) SYSTEM AND METHOD FOR OPTIMIZING FORWARD ERROR CORRECTION ACCORDING TO NUMBER OF SIMULTANEOUS USERS

(71) Applicant: Hughes Network Systems, LLC, Germantown, MD (US)

(72) Inventors: Mustafa Eroz, Germantown, MD (US); Lin-Nan Lee, Potomac, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 22 days.

(21) Appl. No.: 15/844,485

(22) Filed: Dec. 15, 2017

(65) Prior Publication Data

US 2019/0115938 A1    Apr. 18, 2019

Related U.S. Application Data

(60) Provisional application No. 62/572,404, filed on Oct. 13, 2017.

(51) Int. Cl.
*H03M 13/29* (2006.01)
*H03M 13/00* (2006.01)
(Continued)

(52) U.S. Cl.
CPC ..... *H03M 13/2906* (2013.01); *H03M 13/116* (2013.01); *H03M 13/35* (2013.01);
(Continued)

(58) Field of Classification Search
CPC .. H04L 1/0045; H04L 1/0041; H03M 13/616; H03M 13/2906
See application file for complete search history.

(56) References Cited

U.S. PATENT DOCUMENTS 8,683,292 B2    3/2014  Lee et al.
9,461,765 B2   10/2016  Eroz et al.
(Continued)

FOREIGN PATENT DOCUMENTS

WO    2006027668 A1    3/2006

OTHER PUBLICATIONS

Eroz, M., Sun, F.-W. and Lee, L.-N. (2004), DVB-S2 low density parity check codes with near Shannon limit performance. Int. J. Satell. Commun. Network., 22: 269-279. doi:10.1002/sat.787.

(Continued)

*Primary Examiner* — Guy J Lamarre
(74) *Attorney, Agent, or Firm* — NovoTechIP International PLLC

(57) ABSTRACT

Various methods and apparatuses are disclosed, including a method for optimizing FEC code for an average number of interfering users in a multiple access communication, that includes receiving an FEC code optimization information, switchable between at least a first value and a second value, and selecting a first optimized FEC code based at least in part on the FEC code selection information being at the first value, and selecting a second optimized FEC code based at least in part on the FEC code selection information being at the second value. The method can include receiving a source bit stream, encoding bits of the source bit stream according to the selected optimized FEC code into a series of FEC encoded bits, and a parity check matrix of the first optimized FEC code has a first average information bit node degree, and a parity check matrix of the second optimized FEC code has a second average information bit node degree.

20 Claims, 20 Drawing Sheets

(51) Int. Cl.
*H04L 1/00* (2006.01)
*H03M 13/11* (2006.01)
*H03M 13/35* (2006.01)

(52) U.S. Cl.
CPC ..... *H03M 13/616* (2013.01); *H03M 13/6516* (2013.01); *H04L 1/0011* (2013.01); *H04L 1/0015* (2013.01); *H04L 1/0041* (2013.01); *H04L 1/0045* (2013.01); *H04L 1/0057* (2013.01)

(56) References Cited

U.S. PATENT DOCUMENTS

| | | | | |
|---|---|---|---|---|
| 2005/0254458 | A1* | 11/2005 | Proctor, Jr. | H04L 41/12 370/328 |
| 2006/0156179 | A1* | 7/2006 | Shen | H03M 13/03 714/758 |
| 2011/0111766 | A1* | 5/2011 | Yang | H04W 52/241 455/452.2 |
| 2014/0273812 | A1* | 9/2014 | Beeler | H04B 7/18515 455/9 |
| 2016/0233979 | A1 | 8/2016 | Koike-Akino | |

OTHER PUBLICATIONS

Roumy et al: "Characterization and Optimization of LDPC Codes for the 2-User Gaussian Multiple Access Channel", EU RASIP Journal on Wireless Communications and Networking, vol. 2007, No. 1, Jan. 1, 2007 (Jan. 1, 2007), p. 074890.

Zheng et al: "LDPC code design for Gaussian multiple-access channels using dynamic EXIT chart analysis", 2017 IEEE International Conference on Acoustics, Speech and Signal Processing (ICASSP), IEEE, Mar. 5, 2017 (Mar. 5, 2017), pp. 3679-3683.

Sharifi et al: "Implementing the Han-Kobayashi Scheme Using Low Density Parity Check Codes Over Gaussian Interference Chan", IEEE Transactions on Communications, IEEE Service Center, Piscataway, NJ. USA, vol. 63, No. 2, Feb. 1, 2015 (Feb. 1, 2015), pp. 337-350.

Qualcomm: "LDPC rate compatible design overview", 3GPP Draft; RI-1610137 LDPC Rate Compatible Design, 3rd Generation Partnership Project (3GPP), Mobile Competence Centre; 650, Route Des Lucioles ; F-06921 Sophia-Antipolis Cedex; France, vol. RAN WGI, No. Lisbon, Portugal; Oct. 10, 2016-Oct. 14, 2016, Oct. 9, 2016 (Oct. 9, 2016).

International Search Report and Written Opinion dated Jan. 16, 2019 by the International Searching Authority (European Patent Office) in PCT Application PCT/US2018/053830.

\* cited by examiner

US 10,530,394 B2

SYSTEM AND METHOD FOR OPTIMIZING FORWARD ERROR CORRECTION ACCORDING TO NUMBER OF SIMULTANEOUS USERS

CROSS REFERENCE TO RELATED APPLICATION

This application claims the benefit of priority from U.S. Provisional Patent Application Ser. No. 62/572,404 filed Oct. 13, 2017, and entitled "SYSTEM AND METHOD FOR OPTIMIZING FORWARD ERROR CORRECTION ACCORDING TO NUMBER OF SIMULTANEOUS USERS," which is incorporated by reference herein in its entirety.

BACKGROUND

Non-orthogonal multiple access (NOMA) is a wireless bandwidth sharing technique wherein multiple users can concurrently occupy channel bands, with each user optionally encoded by error detection/correction coding, e.g., forward error correction (FEC), and can be sorted at a receiver, by the receiver applying for example a successive interference cancellation (SIC) or other known techniques. This concurrent time-frequency use contrasts to multiplexing techniques such as time-division multiple access (TDMA), frequency-division multiple access (FDMA), and orthogonal frequency-division multiple access (OFDMA), which generally allocate per-user frequency bands, or time slots, or both.

In conventional NOMA techniques, considerable cost can be required for system design and system configuration, to meet performance goals. Such design and system configuration effort can assume a single user scenario, and can identify optimum system parameters for that scenario. Reasons include certain system parameters being fixed, i.e., not sufficiently controllable for effective adaptation to rapidly changing environments, such as the number of concurrent users. Unwanted results can include under-utilization of system resources during light loading intervals, because the system is constructed and configured for a worst-case scenario, and its resources are fixed accordingly. Therefore, current needs include NOMA with substantially increased adaptiveness.

BRIEF DESCRIPTION OF THE DRAWINGS

The drawing figures depict one or more implementations in accord with the present teachings, by way of example only, not by way of limitation. In the figures, like reference numerals refer to the same or similar elements.

LDPC FEC code. Each curve corresponds to a different information bit node degrees, these being 2 and 3.

Figure 22:
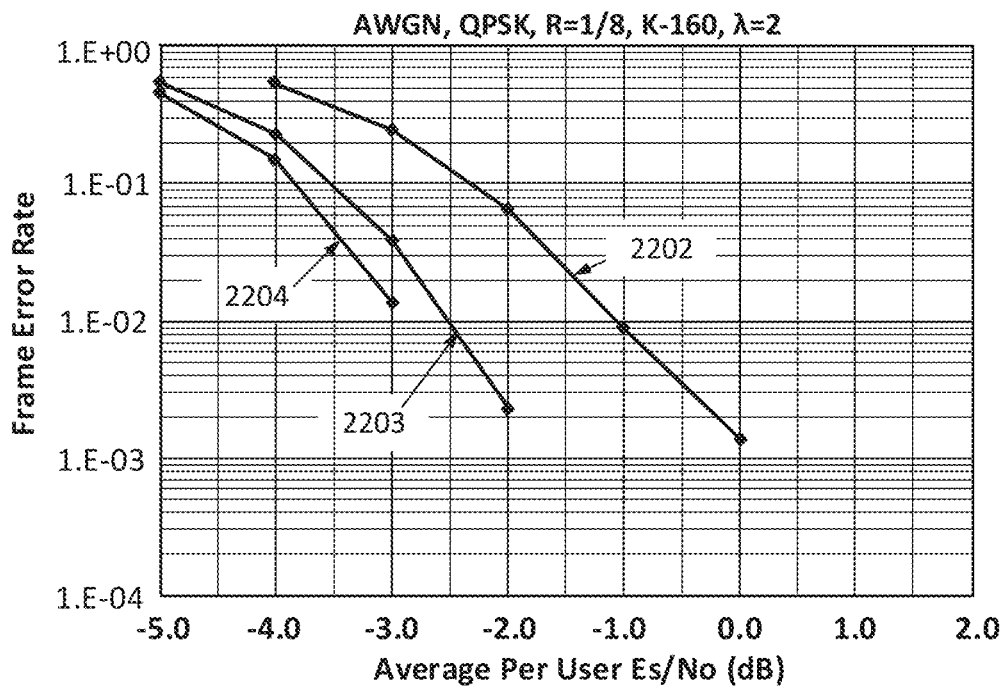
Figure 23:
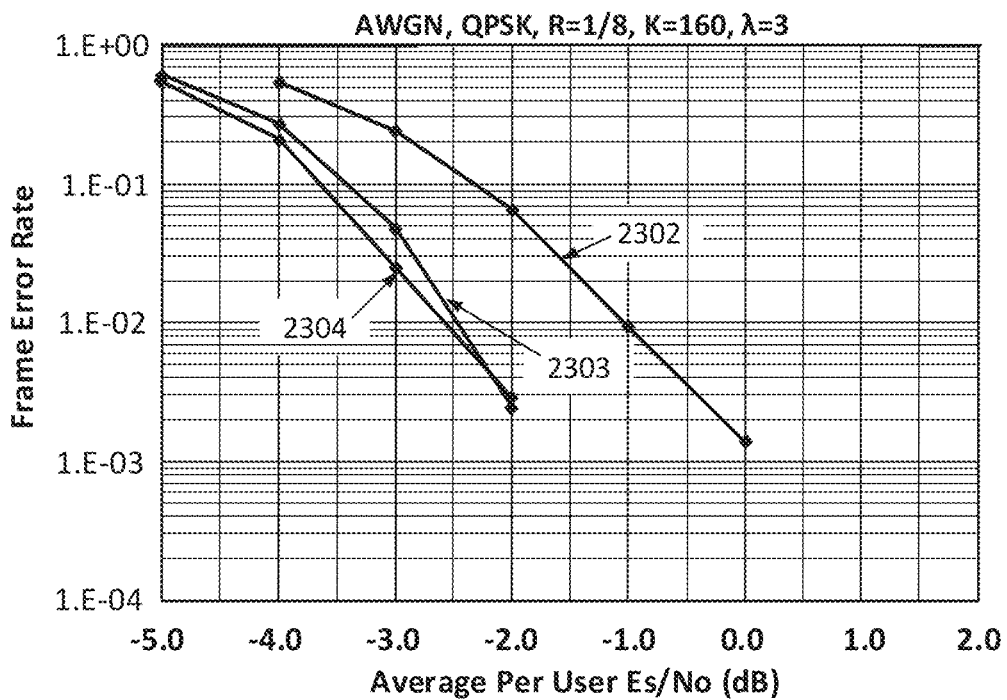
Figure 24:
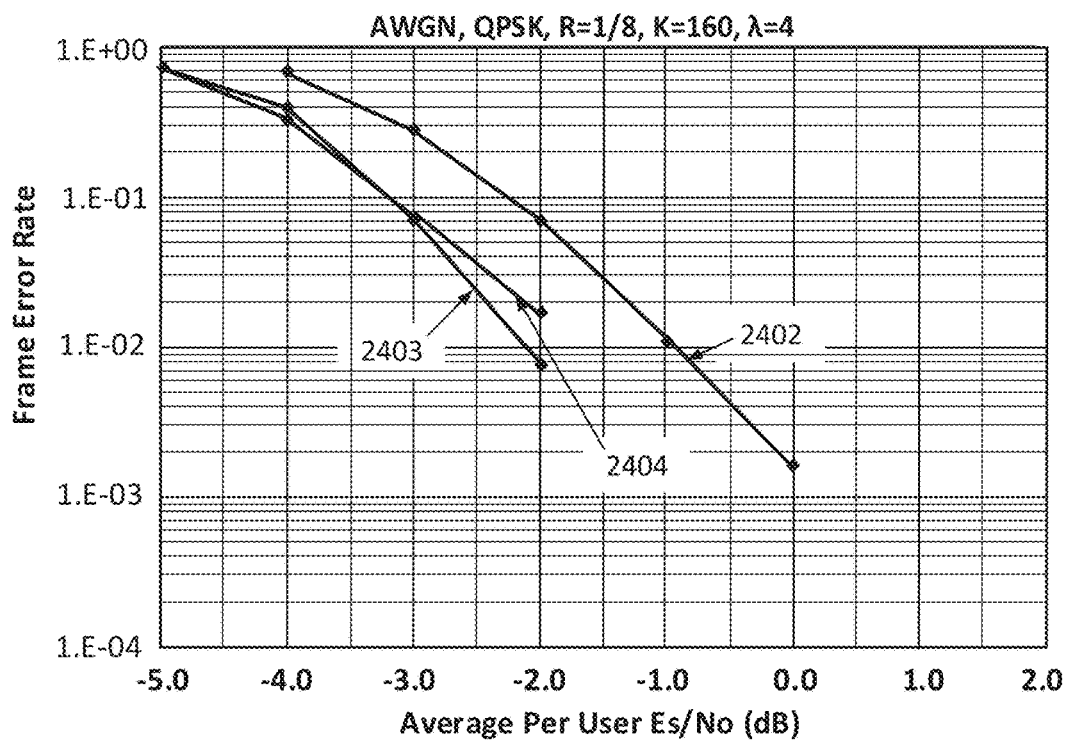

FIGS. 22, 23, and 24 illustrate simulation results of a NOMA communication, in a scenario where user arrival rate is modeled using Poisson distribution with mean arrival rate of λ=2, 3, and 4 users/code block time, respectively, and encoding each user's information bits with a common rate 1/8 LDPC FEC code. Each curve corresponds to a different information bit node degree, these being 2, 3, and 4.

Figure 25:
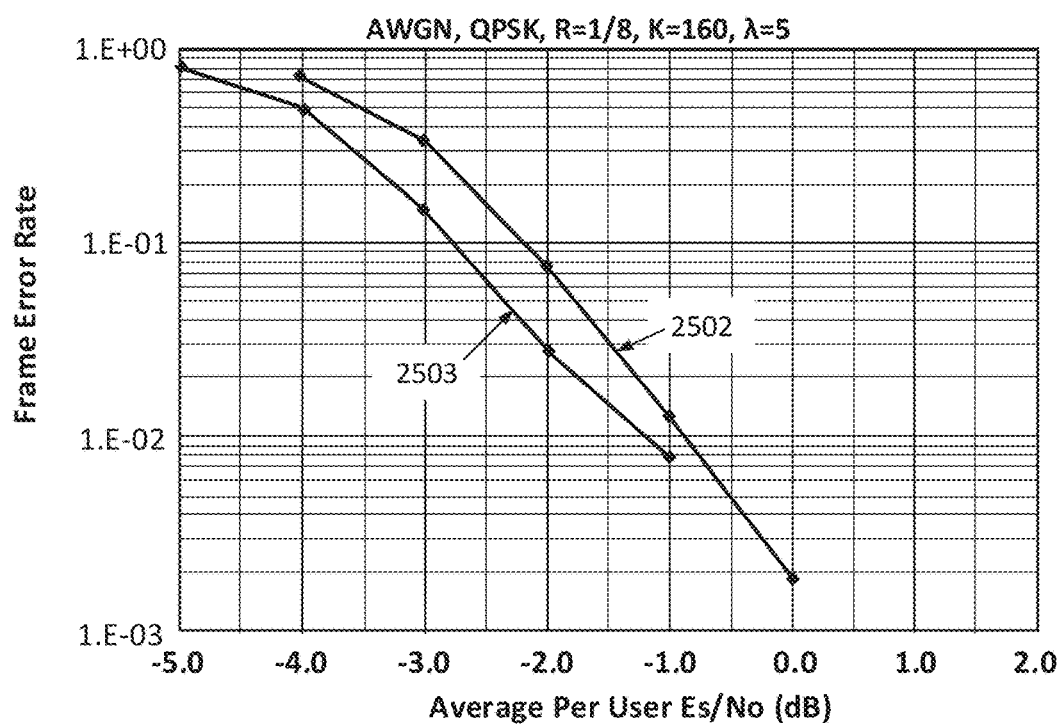
Figure 26:
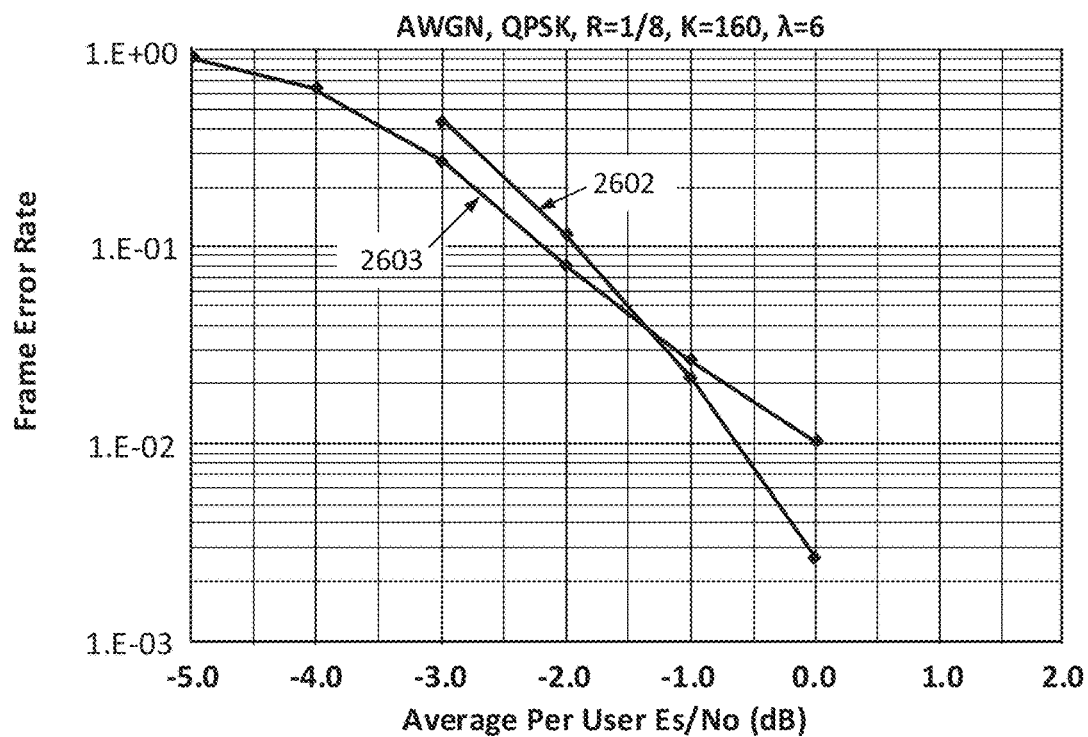
Figure 27:
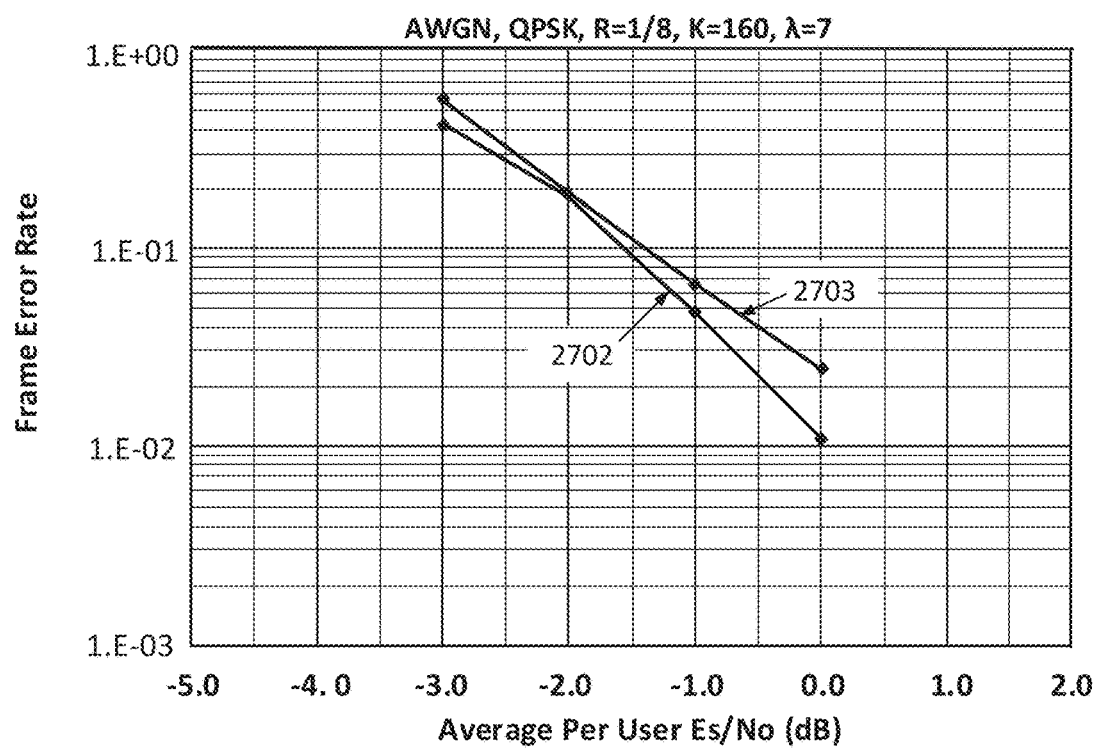

FIGS. 25, 26, and 27 illustrate simulation results of a NOMA communication, in a scenario where user arrival rate is modeled using Poisson distribution with mean arrival rate of λ=5, 6, and 7 users/code block time, respectively, and encoding each user's information bits with a common rate 1/8 LDPC FEC code. Each curve corresponds to a different information bit node degree, these being 2 and 3.

Figure 28:
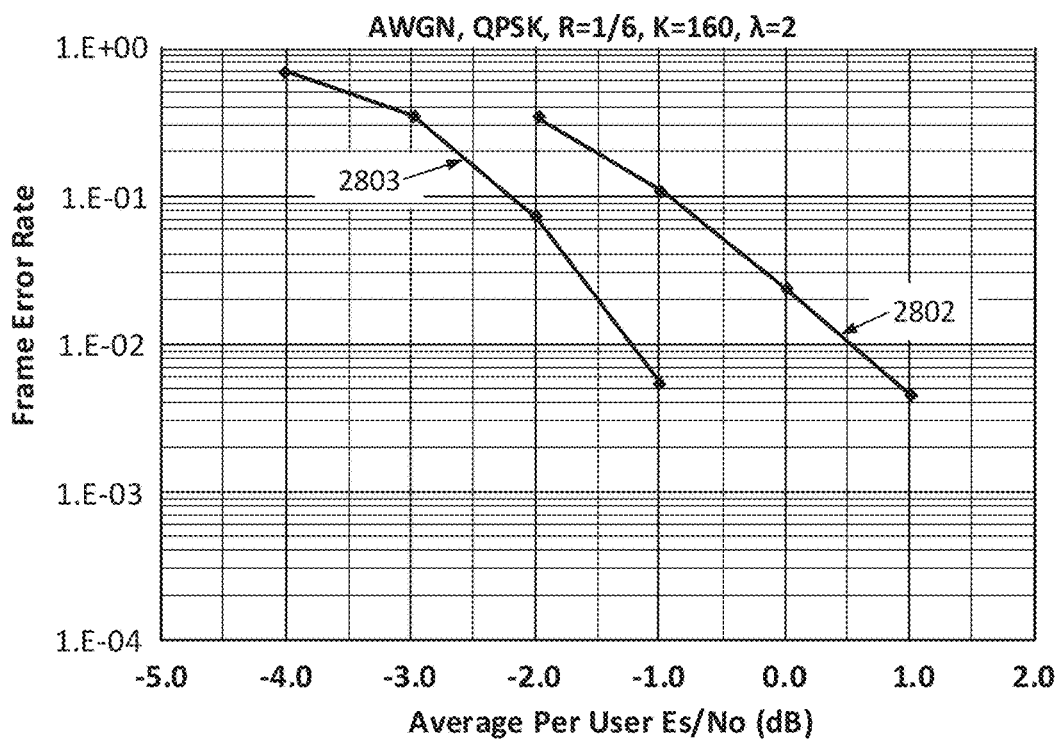
Figure 29:
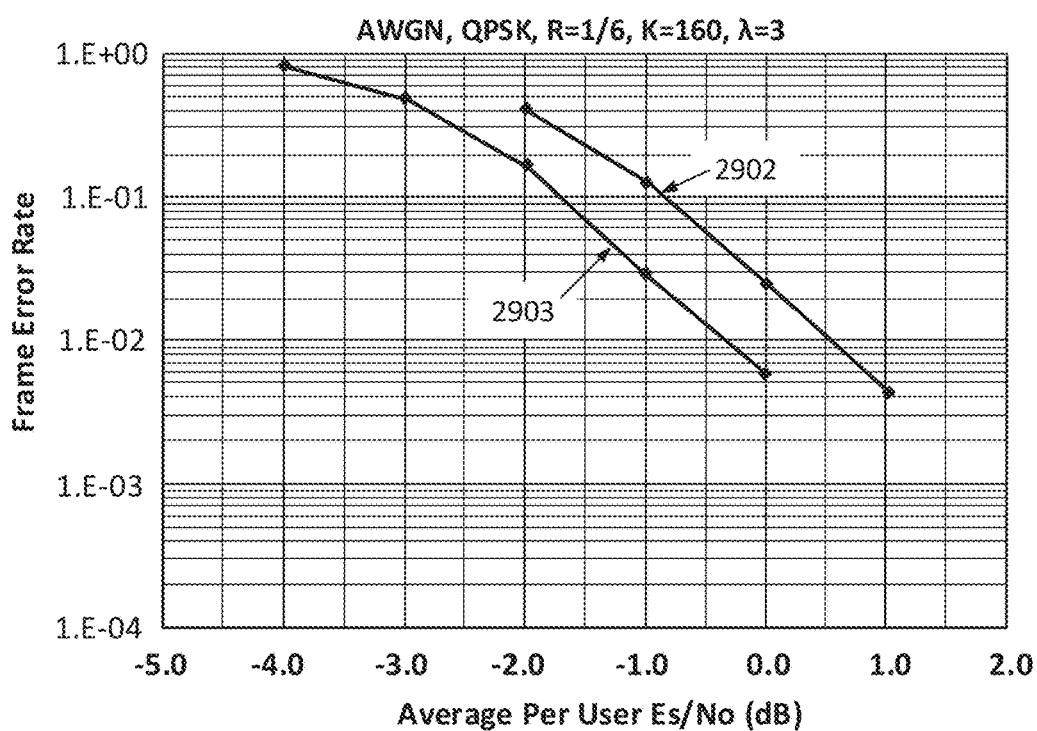
Figure 30:
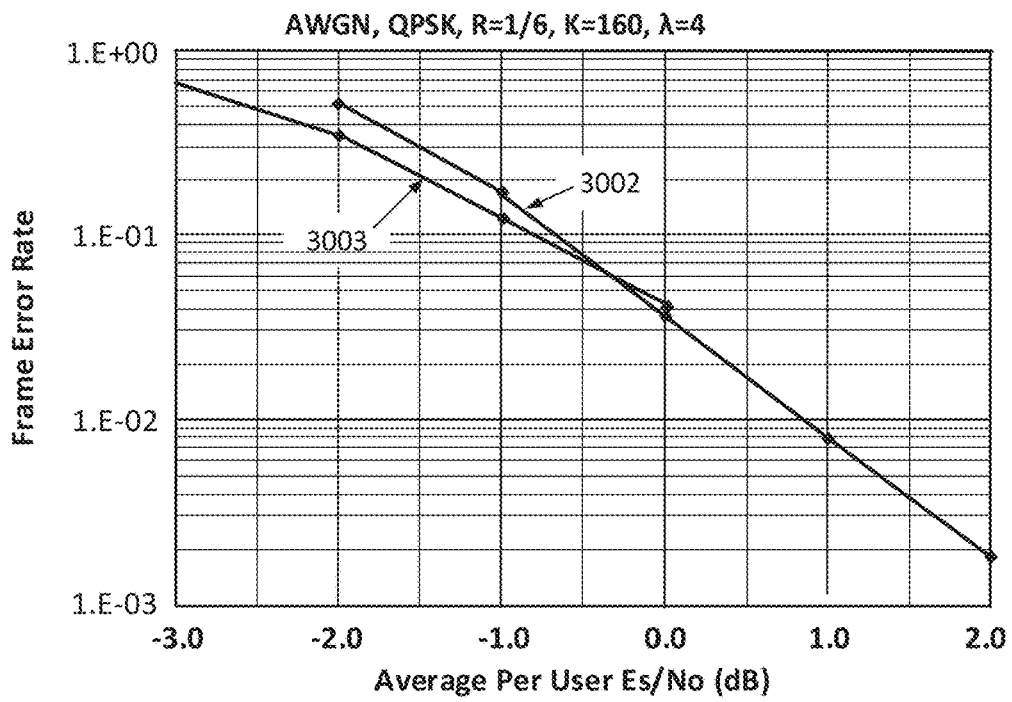

FIGS. 28, 29, and 30 illustrate simulation results of a NOMA communication, in a scenario where user arrival rate is modeled using Poisson distribution with mean arrival rate of λ=2, 3, and 4 users/code block time, respectively, and encoding each user's information bits with a common rate 1/6 LDPC FEC code. Each curve corresponds to a different information bit node degree, these being 2 and 3.

FIGS. 31, 32, 33, and 34 illustrate simulation results of a NOMA communication, in a scenario where user arrival rate is modeled using Poisson distribution with mean arrival rate of λ=2, 9, 10, and 14 users/code block time, respectively, and encoding each user's information bits with a common rate 1/16 LDPC FEC code. Each curve corresponds to a different information bit node degree, these being 2, 3, and 4.

Figure 35:
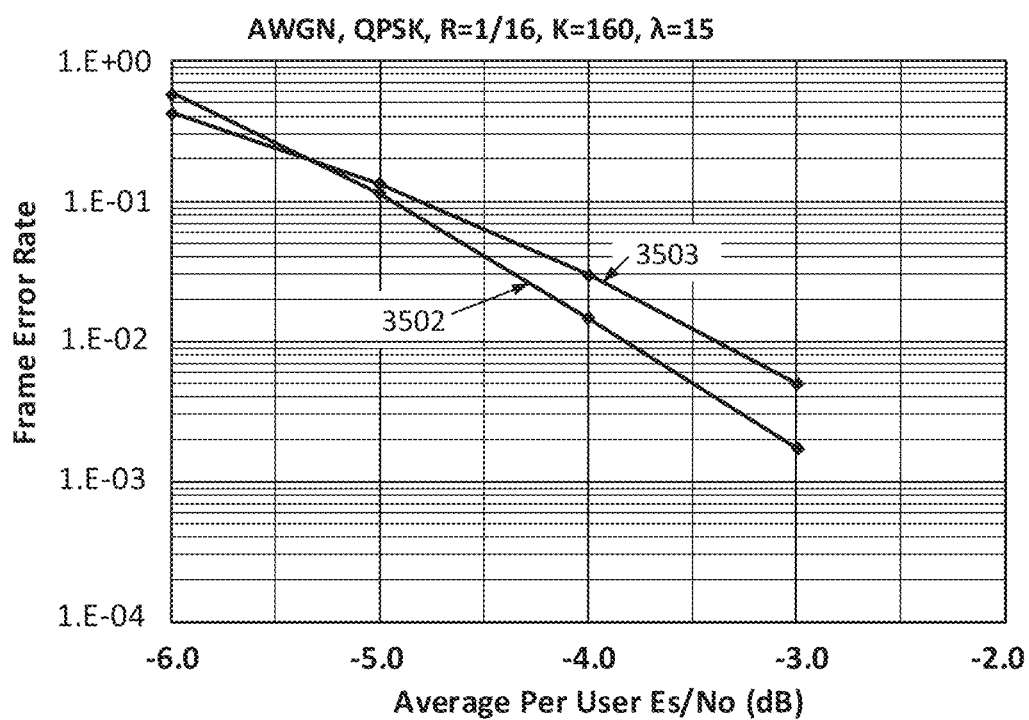

FIG. 35 illustrates simulation results of a NOMA communication, in a scenario where user arrival rate is modeled using Poisson distribution with mean arrival rate of λ=15 users/code block time, respectively, and encoding each user's information bits with a common rate 1/16 LDPC FEC code. Each curve corresponds to a different information bit node degree, these being 2 and 3.

Figure 36:
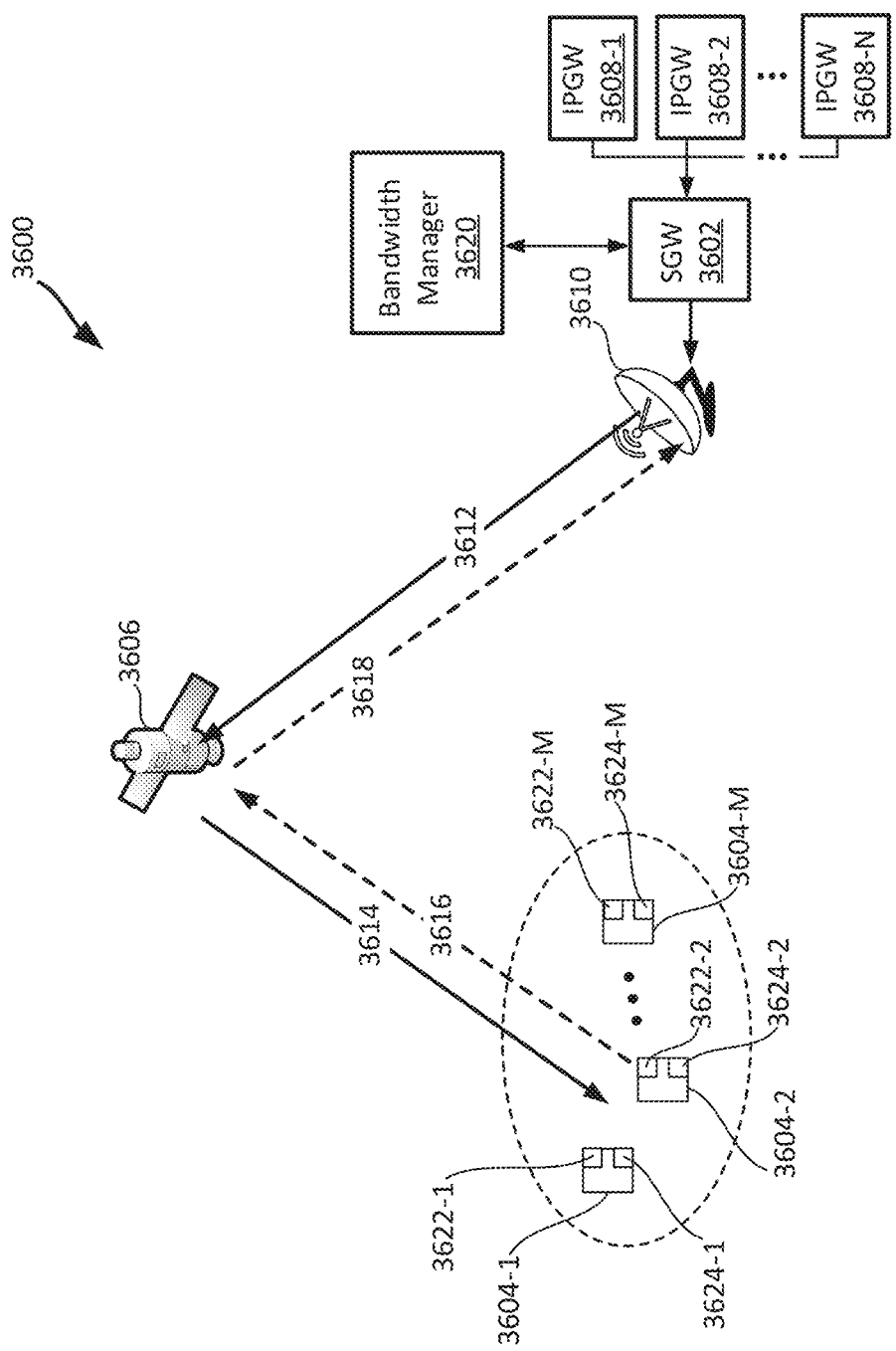

FIG. 36 illustrates an example satellite network in which various aspects of the present disclosure may be implemented.

Figure 37:
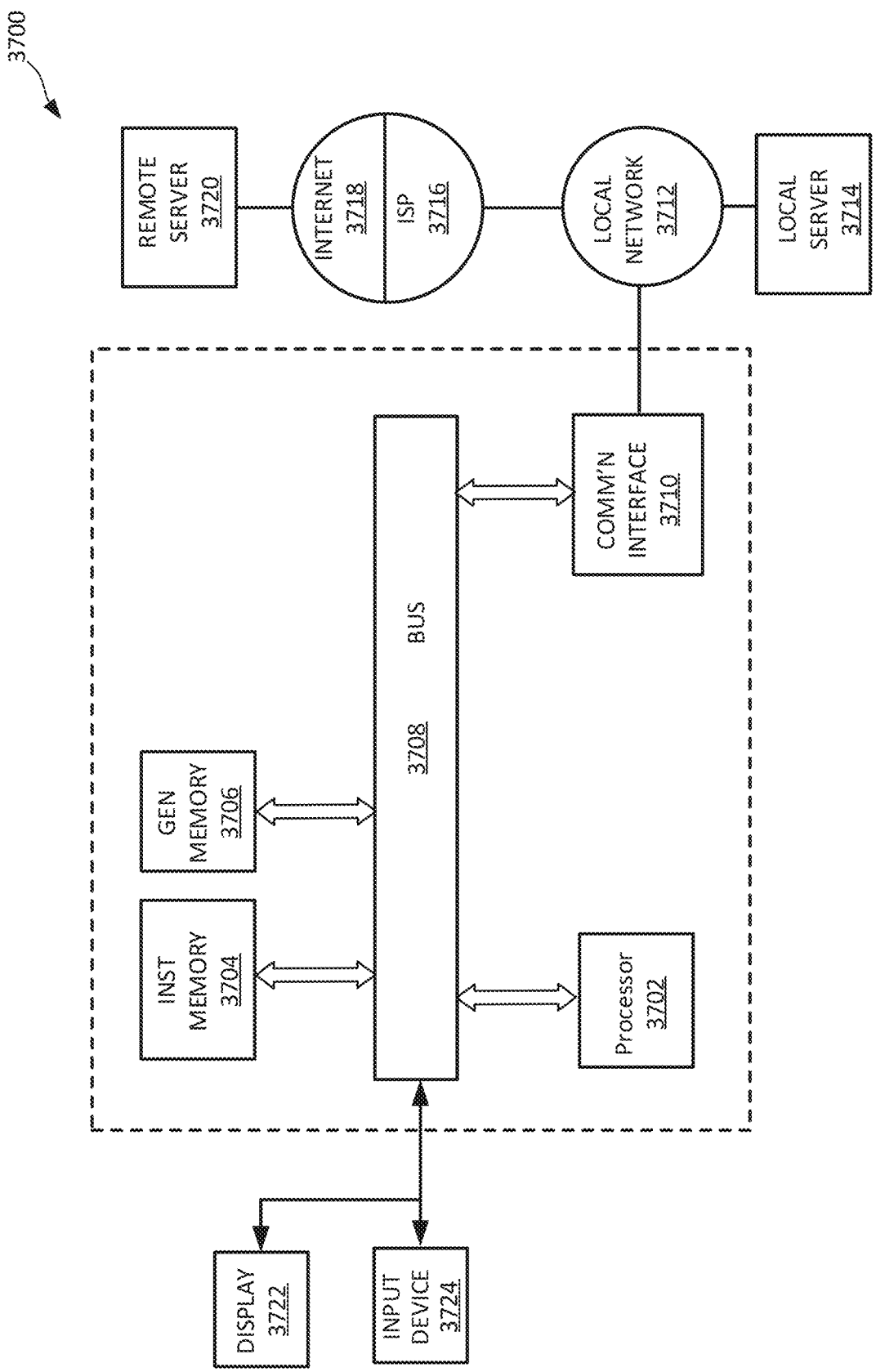

FIG. 37 illustrates a functional block diagram of an example computer system upon which aspects of this disclosure may be implemented.

DETAILED DESCRIPTION

In the following detailed description, certain details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, to avoid unnecessarily obscuring aspects of the present teachings.

Figure 1:
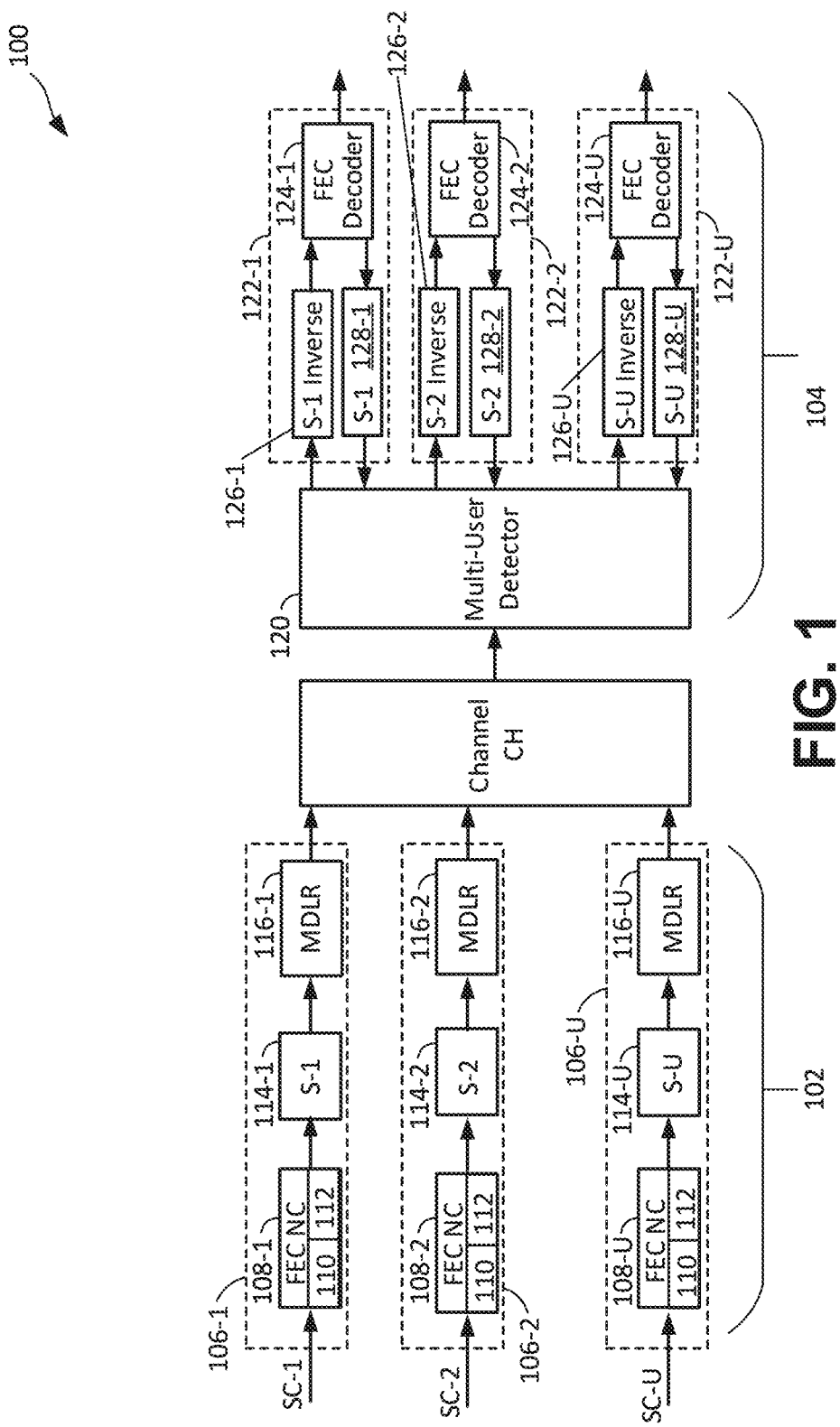
FIG. 1 illustrates an implementation of one example non-orthogonal multiple access (NOMA) communication system, namely scrambled coded multiple access (SCMA), according to one or more aspects.

FIG. 1 illustrates an implementation of one example non-orthogonal multiple access (NOMA) communication system 100 (hereinafter "system 100"), according to one or more aspects. The system 100 can provide multi-user simultaneous asynchronous communication, using LDPC FEC codes with bit node degrees (BNG) that are optimal in accordance with different number of average simultaneous users.

FIG. 1 illustrates system 100 as including a transmission portion 102 and a receiver portion 104, separated by a channel that is modeled by a block labeled "CH."

The transmission portion 102 can include U transmission apparatuses, illustrated as 106-1, 106-2, . . . 106-U (generically "transmission apparatus(es) 106"), with "U" being an integer. Each transmission apparatus 106 can include an optimized BNG FEC encoder 108, examples being illustrated as 108-1, 108-2, . . . 108-U (generically "optimized BNG FEC encoder(s) 108"). Each optimized BNG FEC encoder 108 can receive a corresponding source signal, such as one of the examples SC-1, SC-2, . . . SC-U (generically "SC(s)"), and encode a corresponding K-bit block of that SC signal into an N-bit FEC encoded block. In an aspect, the encoding uses an optimal bit node degree FEC coding generator, with respect to bit or frame error rate, selected according to a target average number of simultaneously transmitting users, meaning user using the same time and frequency space as the transmission apparatus 106, through a common channel. The average number of simultaneously transmitting users will be referred to as "λ." For purposes of description, the simultaneously transmitting users can be interchangeably referred to as "interfering users" or "interfering users in a multiple access communication."

Implementations of providing the optimized BNG FEC encoder 108 with optimal FEC codes can include a logic, such as the illustrated optimized FEC code selecting logic 110 and an FEC code storage 112. In one implementation, the FEC code storage 112 can store a plurality of different bit node degree FEC codes, and may store a plurality of different FEC codes with the same bit node degree but different FEC code rates.

The optimal FEC code selecting logic 110 can be configured, for example as a controller, capable of receiving an externally supplied FEC code select instruction (not explicitly visible in FIG. 1), configured, for example to include a FEC code select field (not visible in FIG. 1). The FEC code select field can be configured to carry information that can directly identify a particular BNG FEC code in the FEC code storage 112. The optimal FEC code selecting logic 110 can then use that information in the FEC code select field, directly or by translation to an internal address maintained by the logic 110, to retrieve the identified BNG FEC code from the FEC code storage 112. In one illustrative implementation, the FEC code select field can carry a value switchable, for example by an external instruction generator, between at least a first value and a second value. The optimal FEC code selecting logic 110 can be correspondingly configured to select, for example, a first BNG FEC code based at least in part on the first value, and select a second BNG FEC code based at least in part on the second value.

Regarding generation, and input to the optimal FEC code selecting logic 110 (e.g., controller) of the FEC code select instruction, one implementation can include configuring the optimal FEC code selecting logic 110 with an interface for receiving such an instruction from, for example, a technician's set-up equipment at time of installing the transmission device 106. As one illustration, at time of installation a technician may take measurements of signal interference, at the installation location, within the transmission device transmit band. Such measurements may be performed over a duration sufficient to model the statistics of the interference, for example, as a Poisson arrival process. Determination of an appropriate duration or duration range can be readily performed by a person of ordinary skill in the art upon reading this disclosure. Further detailed description of such determination is therefore omitted. The technician can then convert or map the interference measurement to an identifier of a specific BNG FEC code within the FEC code storage 112. The technician can then input that specific identifier to the optimal FEC code selection logic 110.

In another implementation, a technician can determine, based for example on the above-described measurements, a target average number of interfering users for the installation site, and then input that target number into the FEC code selection logic 110, instead of inputting the code selection information. Further to the implementation, the optimal FEC code selection logic 110 can be configured with a mapping or selection logic that, based at least in part on the received target average number of interfering users, λ, can select the optimal BNG FEC code for that λ number. According to one or more aspects, the selection can be from different BNG FEC codes having the same rate, for example, without limitation, 1/8, 1/9, and 1/15 and others. In one implementation according to this aspect, one of the rates is selected. Then, selection of the optimal BNG FEC code for a target λ can include generation, e.g., by the optimal FEC code selecting logic 110, of a multiplication product of λ and the selected FEC code rate. In one or more implementations, configuration of the optimal FEC code selecting logic 110 can include selection rules, based at least in part on ranges and thresholds of that multiplication product. Examples of such selection rules are described in greater detail in later sections of this disclosure.

In still another implementation, the FEC code selection logic 110 can be configured to monitor, e.g., periodically, an average number of interfering users at the location of the transmission device 106. The FEC code selection logic 110 can be further configured such that, upon the product of the detected average number of interfering users moving from one range to another, e.g., exceeding or falling under one or more thresholds, the logic 110 can switch the currently selected optimal BNG FEC code to a new optimal BNG FEC code, optimized for the product being within the new range. As illustration, the FEC code selection logic 110 can be configured such that, upon the product of the detected average number of interfering users and the FEC code rate being within a first range, to automatically select a first BNG FEC code and, upon the product of the detected average number of interfering users and the FEC code rate being within a second range, to automatically select a second FEC code.

Referring to FIG. 1, each transmission apparatus 106 can include a scrambler, such as the examples numbered 114-1, 114-2, ... 114-U (generically "scrambler(s) 114"). Operations of the scramblers 114 can include each codeword output $c_k = (c_{k1} \ldots, ckN)$ from its corresponding optimized BNG FEC encoder 108 being scrambled with a user specific scrambler $s_k = (s_{k1} \ldots, skN)$ i.e., the scrambled sequence $d_k = (d_{k1} \ldots, dkN)$ can be according to Equation (1):

$$d_{ki} = c_{ki} + s_{ki}$$ Equation (1), where the operator "+" denotes modulo-2 addition.

The scramblers 114 can be implemented by mutually identical hardware, and apply a mutually identical type of scrambling process, with different configurations to generate different scrambling. The scramblers 114 can therefore be referred to as "user-specific scramblers 114." The scramblers 114 can each feed a corresponding modulator, such as the examples numbered 116-1, 116-2, ... 116-U (generically "modulator(s) 116").

Modulation type can be quadrature phase shift keying (QPSK), but QPSK is only one implementation, and is not intended as any limitation on the type of modulation applied by the modulators 116. In an implementation, each transmission unit 106 can include a corresponding antenna (not visible in FIG. 1), configured to wirelessly transmit the modulated RF signal through the channel CH.

The receiving portion 104 of the system 100 can include a joint detector/interference canceller unit 120 and R receiving apparatuses, such as the examples 122-1, 122-2, ... 122-R, (generically "receiving apparatus(es) 122"), "R" being an integer. The value of R can be, but is not necessarily equal to U. Each receiving apparatus 122 can include an FEC (e.g., LDPC) decoder, such as the examples 124-1, 124-2, ... 124-R (generically "FEC decoder(s) 124"). In an implementation, the FEC decoders 124 and the joint detector/interference canceller unit 120 can be configured to interact to iteratively produce an estimate of the received codewords.

Features for providing the iterative estimation can include, in the receiving apparatuses 122, a descrambler, 126-1, 126-2, ... 126-R (generically "descrambler(s) 126"), and a scrambler 128-1, 128-2, ... 128-R (generically "scrambler(s) 128"). Features for providing iterative estimation can also include, in the receiver portion 104, a buffer (not visible in FIG. 1), configured to store a block of a signal composed of a summation of received signals from all of the transmission apparatuses 106 of the transmission portion 102. The summation can be termed a composite signal.

In an implementation of the receiver portion 104, upon a block of the composite waveform being sampled and stored in the receiver portion's buffer, a first pass by the receiver portion 104 can start by using the first descrambler, 126-1, and the first FEC (e.g., LDPC) decoder 124-1 to estimate a first bit-stream, i.e., a recovered SC-1. The joint detector/interference canceller unit 120 can then modify the stored block of the composite waveform using the estimated first bit stream. The receiver portion 104 can then use the second descrambler, 126-2, and the second FEC (e.g., LDPC) decoder 124-2 to estimate a second bit-stream, i.e., a recovered SC-2. When all the R bit-streams have been estimated, the receiver portion 104 can perform a second pass, starting with a second-pass estimation of the first bit-stream, again using the first descrambler 126-1 and the first FEC decoder 124-1 for a second pass estimation of the first bit-stream. The above-described process can repeat for a required number of passes, and when completed can generate estimates of all the bit streams SC. It should be noted that the multiple access scheme in FIG. 1 that include scramblers 114 and the associated receiver structure 104 is given as an illustration only. The optimized BNG FEC codes described here can be used with other multiple access schemes or other receiver architectures as well.

As described, the optimized BNG FEC encoders 108 can be configured to select, for example in response to an instruction, or in response to input of a target value of λ, an FEC code having an information bit node degree optimal for the target value of λ. In an aspect the optimal BNG FEC selector logic 110, or another controller resource in the transmission apparatus 106, can be configured to monitor the average number of interfering users and, based in part on same, select an optimal BNG FEC encoder from the storage 112.

Benefits and features can include an arbitrary number of users can use the channel CH simultaneously. Benefits and features can also include users transmitting asynchronously without any coordination among themselves. In other words partial overlap between users are permitted.

Figures 2, 3:
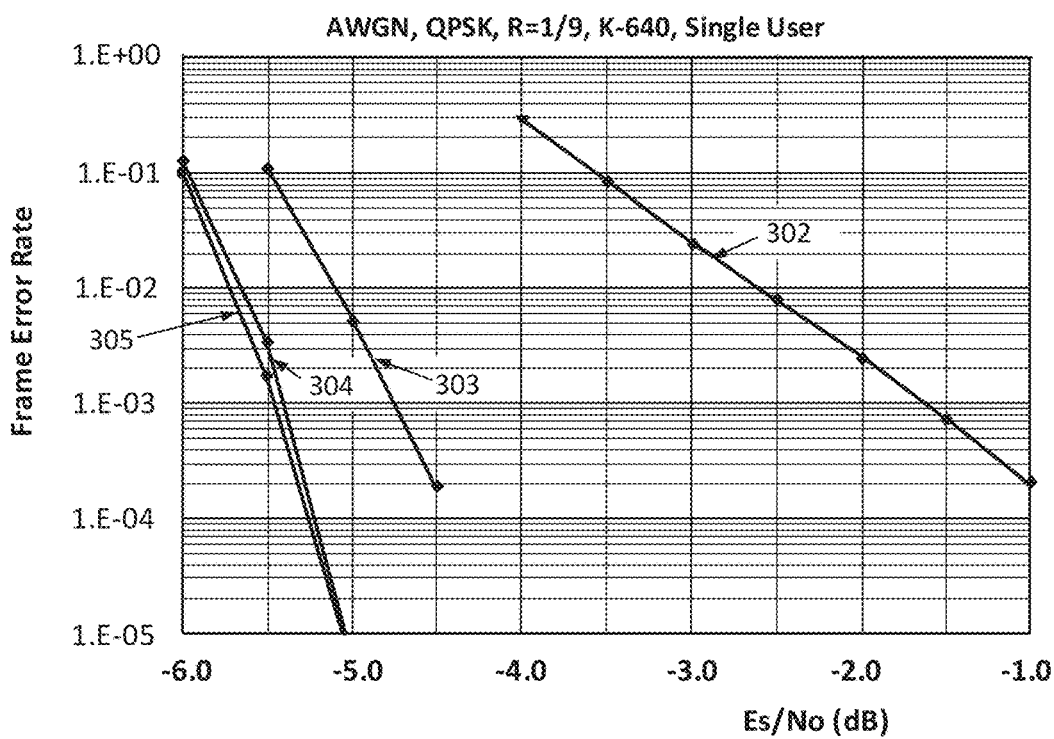
FIG. 2 illustrates one example forward error correction (FEC), parity check matrix according to one or more aspects.
FIG. 3 illustrates a simulation result of single user communication performance, applying four different rate 1/9 low density parity check (LDPC) codes, having respective information bit node degrees of 2, 3, 4, and 5.

In an LDPC implementation of the optimized BNG FEC encoders 108, LDPC codes can be of a class such as illustrated by the FIG. 2 example parity check matrix 200. Each entry of the illustrated parity check matrix 200 is an M×M submatrix, M being an integer. The entries are marked "−" or "0" or "D" or "m" m being a positive integer less than M. The entry "−" represents an M×M all zero matrix. The entry "0" represents an M×M identity matrix. The entry "m" represents an M×M identity matrix with its columns circularly shifted to the right m times, and the entry "D" represents an M×M special matrix, such as set forth in the following Equation (2)

$$D = \begin{bmatrix} 0 & & & & 0 \\ 1 & 0 & & & \\ & 1 & 0 & & \\ & & \ddots & \ddots & \\ 0 & & & 1 & 0 \end{bmatrix}_{M \times M}$$

Equation (2)

Referring to FIG. 2, the systematic part of the parity check matrix 200 corresponds to information bits, e.g., bits in one of the user bits streams SC. In the systematic part, most of the entries are "−", i.e., all zero submatrices. This is similar to the parity part. There are only a few nonzero entries, each being an M×M circularly shifted identity matrices. Each column corresponds to a node. Therefore, the number of nonzero entries in each column can be termed the degree of the particular node corresponding to the column. Therefore, in the FIG. 2 parity check matrix 200, all but one of the parity bit nodes have degree 2, the one parity node having degree 1. The degree of the information bit nodes in the systematic part of the matrix 200 depends on the number of nonzero submatrices (not visible in FIG. 2).

The parity part of the FIG. 2 matrix 200 illustrates only one example. Features and aspects of optimal (in acccordance with target $\lambda$) information bit node degree FEC codes, including methodology described in greater detail below for determining optimal information bit node degree FEC codes for various values and ranges of $\lambda$, can have other parity parts. The meaning of "information bit node degree" is well-established, and known to persons of ordinary skill in the art pertaining to this disclosure, and therefore further detailed description is omitted.

FIG. 3 illustrates a simulation result of single user performance, applying four different rate 1/9 LDPC codes, having respective information bit node degrees of 2, 3, 4, and 5. It will be understood that "rate," as used in this disclosure, means FEC code rade. For purposes of description, the 1/9 LDPC code having information bit node degree of 5 can be referred to as a "first FEC code," and the 1/9 LDPC code having information bit node degree of 4 can be referred to as a "second FEC code," and so on. As understood by persons of ordinary skill upon reading this disclosure, the first FEC code has a corresponding parity check matrix, having a first average information bit node degree of 5, and the second FEC code has a corresponding parity check matrix, which has a second average information bit node degree of 4. It will be understood that the above assignment of the label "first" to the 1/9 LDPC code having information bit node degree of 5 is arbitrary, and that an alternative labelling can assign the label "first" to the 1/9 LDPC code having information bit node degree 2.

The horizontal axis of FIG. 3, and of all of the other simulation figures appended hereto, is the average per user signal to noise ratio, Es/No, in units of dB. Multi-user simulations (i.e., all of the figures except FIG. 3) assume a Poisson model for the number of simultaneous interfering users, with a mean arrival rate of $\lambda$ users per codeblock time.

As used herein, "codeblock time" means the amount of time it takes to transmit N coded bits, N being the size of the FEC encoded blocks in bits. The four different rate 1/9 LDPC codes have K of 640, i.e., 640 information bits per coded block, and N=9×K=5760 coded bits per coded block. As illustrated in FIG. 3, the simulation assumes additive white Gaussian noise, and the modulation (e.g., by modulators 116) being QPSK. Frame error rate performance of the 1/9 LDPC code of information bit node degree 2 is shown by plot line 302. Frame error rate performance of the 1/9 LDPC code of information bit node degree 3 is shown by plot line 303. Frame error rate performances of the 1/9 LDPC code of information bit node degrees 4 and 5 are shown, respectively, by plot lines 304 and 305.

Figure 4:
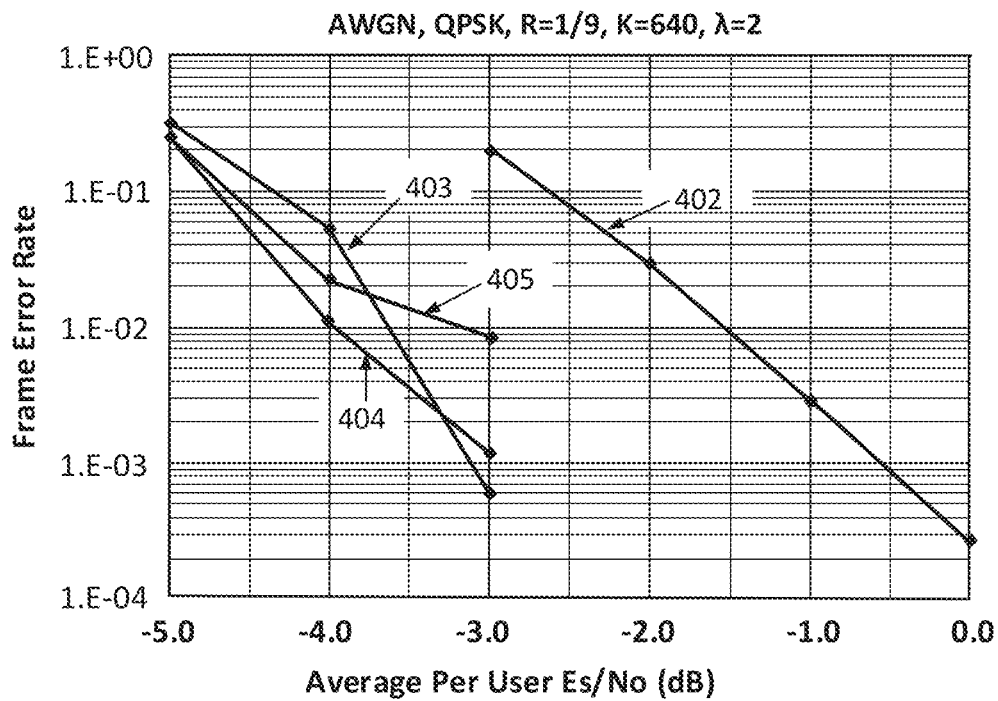
FIG. 4 illustrates a simulation result of a NOMA communication, in a scenario where user arrival rate is modeled using Poisson distribution with mean arrival rate of $\lambda=2$ users/code block time, and encoding each user's information bits with a common rate 1/9 LDPC FEC code. Each curve corresponds to a different information bit node degree, these being 2, 3, 4, and 5.

FIG. 4 illustrates simulation results showing frame error rate performance provided by the modeled NOMA communication system, applying four different exemplary LDPC codes of rate 1/9, in a Poisson arrival rate $\lambda$=2 users per codeblock time. The four LDPC codes had respective information bit node degrees of 2, 3, 4, and 5. Frame error rate performance of the 1/9 LDPC code of information bit node degree 2 is shown by plot line 402. Frame error rate performance of the 1/9 LDPC code of information bit node degree 3 is shown by plot line 403. Frame error rate performances of the 1/9 LDPC code of information bit node degrees 4 and 5 are shown, respectively, by plot lines 404 and 405.

FIGS. 5-16 illustrate simulation results showing frame error rate performance provided by the modeled NOMA communication system, each applying different exemplary LDPC codes of rate 1/9 with information bit node degree either 5, 4, 3, or 2, in various Poisson arrival rate scenarios as described in greater detail in later paragraphs.

Based on the simulation results of FIGS. 4-16, using a FER region in the vicinity of $10^{-2}$, optimal information bit node degrees for different ranges of $\lambda$ were determined and are shown in Table 1A. The table groups the ranges according to the multiplication product of the rate (R=1/9) and $\lambda$, i.e., R×$\lambda$.

TABLE 1A

Optimum information bit node degree for various throughputs for rate R = 1/9

| Range (R × $\lambda$) | Optimized FEC Code | Information Bit Node Degree of Optimized FEC Code |
|---|---|---|
| First, less than 0.3 | First Optimized FEC Code | 4 |
| Second, between 0.3 and 0.8 | Second Optimized FEC Code | 3 |
| Third, more than 0.8 | Third Optimized FEC Code | 2 |

Accordingly, applying the methodology described above produces a set (or equivalent plurality) of $\lambda$ optimal FEC (e.g., LDPC) codes, and in an aspect, the bit node degree of the optimal selection decreases as $\lambda$ increases, and increases as $\lambda$ decreases. Stated differently, the optimum information bit node degree changes inversely proportional to $\lambda$.

Table 1B below is a generic form of Table 1A:

TABLE 1B

| Range (R × λ) | Optimized FEC Code | Information Bit Node Degree of Optimized FEC Code |
|---|---|---|
| First, less than C1 | First Optimized FEC Code | First Node Degree Value |
| Second, between C1 and C2 | Second Optimized FEC Code | Second Node Degree Value |
| Third, more than C2 | Third Optimized FEC Code | Third Node Degree Value |

Configuring Table 1B as Table 1A, C1 is equal to 0.3, C2 is equal to 0.8, the First Optimum Information Bit Node Degree is 4, the Second Optimum Information Bit Node Degree is 3, and the Third Optimum Information Bit Node Degree is 2.

For the simulations illustrated in FIGS. 4-16, and for the Table 1B groupings, the LDPC codes were of constant information bit node degree. However, implementations are not necessarily limited to FEC (e.g., LDPC) codes having constant information bit node degree. On the contrary, it is contemplated that implementations can be configured to apply, based on a target λ, optimal FEC codes from among a set, cache, library or equivalent of multiple FEC codes, including two or more FEC codes having non-constant, or varying information bit node degree, and that in such implementations the relation between the target λ and the numerical average informational bit node degree of the optimal FEC code can have the inverse proportionality as described above for constant information bit node degree. For example, one arrangement could provide for choosing, or automatically selecting between a first FEC code and a second FEC code. In such an arrangement, a parity check matrix of the first FEC code can have a first average information bit node degree, and a parity check matrix of the second FEC code can have a second average information bit node degree In an aspect, sets, libraries, or equivalents of FEC codes from which to make λ-dependent selection (or partly λ-dependent selection) of optimal FEC code can include implementation where the optimal FEC code(s) for one or more target λ is (are) constant bit node degree FEC codes, while optimal FEC code(s) for another one or more target λ is (are) non-constant bit node degree codes.

FIGS. 17-21 illustrate simulation results showing frame error rate performance provided by the modeled NOMA communication system, each simulation applying different exemplary LDPC codes of rate 1/15 with information bit node degree, either 4, 3, or 2, in various Poisson arrival rate scenarios (i.e., various values of λ users/codeblock time), as described in greater detail in later paragraphs.

Based on the simulation results illustrated in FIGS. 17-21, using the FER region of around $10^{-2}$, optimal information bit node degrees for different ranges of λ were determined and are shown in Table 2. Table 2 groups the ranges according to the rate (1/15) multiplied by λ.

TABLE 2

Optimum information bit node degree for various throughputs for rate R = 1/15

| Range (R × λ) | Optimized FEC Code | Information Bit Node Degree of Optimized FEC Code |
|---|---|---|
| First, less than 0.5 | First Optimized FEC Code | 4 |
| Second, between 0.5 and 0.9 | Second Optimized FEC Code | 3 |
| Third, more than 0.9 | Third Optimized FEC Code | 2 |

Referring to Table 2 as a particular configuration of Table 1B, C1 is equal to 0.5, C2 is equal to 0.9, the First Optimum Information Bit Node Degree is 4, the Second Optimum Information Bit Node Degree is 3, the ThirdOptimum Information Bit Node Degree is 2.

FIGS. 22-27 illustrate simulation results showing frame error rate performance provided by the modeled NOMA communication system, each simulation applying different exemplary LDPC codes of rate 1/8 with information bit node degree, either 4, 3, or 2, in various Poisson arrival rate scenarios (i.e., various values of λ users/codeblock time), as described in greater detail in later paragraphs.

Based on the simulation results illustrated in FIGS. 22-27, using the FER region of around $10^{-2}$, optimal information bit node degrees for different ranges of λ were determined and are shown in Table 3. Table 3 groups the ranges according to the rate R (1/8) multiplied by λ.

TABLE 3

Optimum information bit node degree for various throughputs for rate R = 1/8

| Range (R × λ) | Optimized FEC Code | Information Bit Node Degree of Optimized FEC Code |
|---|---|---|
| First, less than 0.3 | First Optimized FEC Code | 4 |
| Second, between 0.3 and 0.7 | Second Optimized FEC Code | 3 |
| Third, more than 0.7 | Third Optimized FEC Code | 2 |

Referring to Table 3 as a particular configuration of Table 1A, C1 is equal to 0.3, C2 is equal to 0.7, the First Optimum Information Bit Node Degree is 4, the Second Optimum Information Bit Node Degree is 3, the ThirdOptimum Information Bit Node Degree is 2.

FIGS. 28-30 illustrate simulation results showing frame error rate performance provided by the modeled NOMA communication system, each simulation applying different exemplary LDPC codes of rate 1/6 with information bit node degree, either 3, or 2, in various Poisson arrival rate scenarios (i.e., various values of λ users/codeblock time), as described in greater detail in later paragraphs.

Based on the simulation results illustrated in FIGS. 28-30, using the FER region of around $10^{-2}$, optimal information bit node degrees for different ranges of λ were determined and are shown in Table 4. Table 4 groups ranges according to the rate (1/6) multiplied by λ.

TABLE 4

Optimum information bit node degree for
various throughputs for rate R = 1/6

| Range (R × λ) | Optimized FEC Code | Information Bit Node Degree of Optimized FEC Code |
|---|---|---|
| First, less than 0.6 | First Optimized FEC Code | 3 |
| Second, more than 0.6 | Second Optimized FEC Code | 2 |

Simulation results illustrated by FIGS. 28-30 are described in greater detail in the following paragraphs. All can assume the same modeled NOMA communication system.

FIGS. 31-34 illustrate simulation results showing frame error rate performance provided by the modeled NOMA communication system, each simulation applying three different exemplary LDPC codes of rate 1/16, with information bit node degrees, 4, 3, and 2, respectively, in various Poisson arrival rate scenarios (i.e., various values of λ users/codeblock time), as described in greater detail in later paragraphs.

FIG. 35 illustrates simulation results showing frame error rate performance provided by the modeled NOMA communication system, applying two different exemplary LDPC codes of rate 1/16, one with information bit node degree 3 and the other with information bit node degree 2, using a Poisson arrival rate scenario of λ=15 users/codeblock time, as described in greater detail in later paragraphs.

Based on the simulation results illustrated in FIGS. 31-35, using the FER region of around $10^{-2}$, optimal information bit node degrees for different ranges of λ were determined and are shown in Table 5. Table 5 groups the ranges according to the rate R (1/16) multiplied by λ.

TABLE 5

Optimum information bit node degree for
various throughputs for rate R = 1/16

| Range (R × λ) | Optimized FEC Code | Information Bit Node Degree of Optimized FEC Code |
|---|---|---|
| First, less than 0.55 | First Optimized FEC Code | 4 |
| Second, between 0.55 and 0.9 | Second Optimized FEC Code | 3 |
| Third, more than 0.9 | Third Optimized FEC Code | 2 |

Referring to FIG. 4, the figure illustrates simulation results showing frame error rate performance provided by the modeled NOMA communication system, applying four different exemplary LDPC codes of rate 1/9, using a simultaneous user scenario of mean Poisson arrival rate λ=2 users/codeblock time, and information node bit degrees of 2, 3, 4, and 5. Frame error rate performance, for codes with information node bit degrees 2, 3, 4, and 5, respectively, is shown by plot lines 402, 403, 404, and 405.

Figure 5:
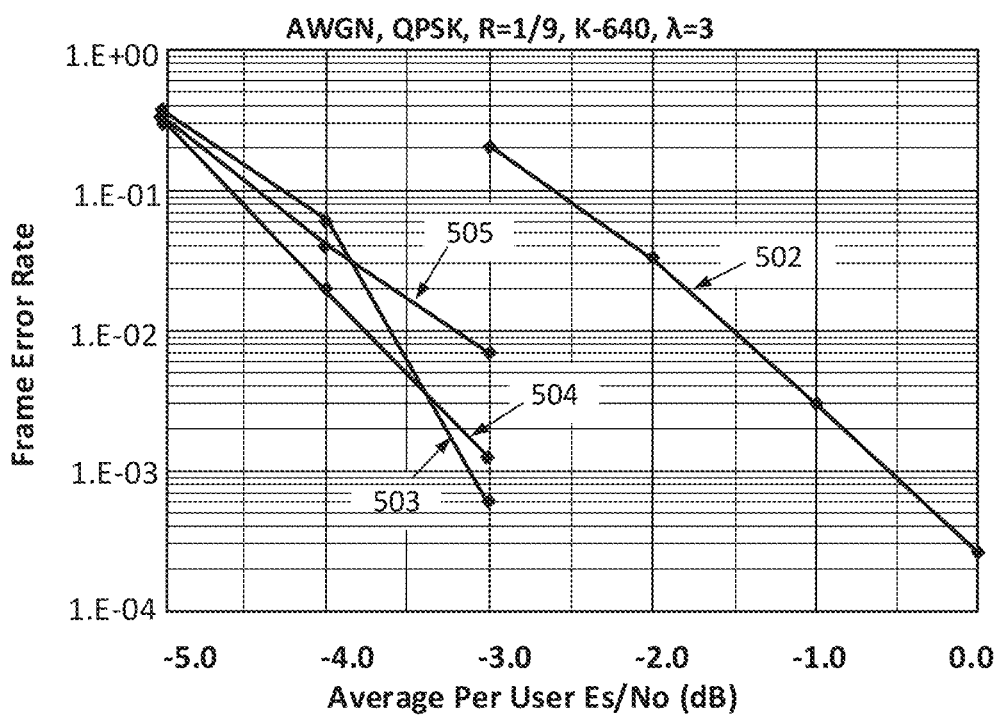
FIG. 5 illustrates a simulation result of a NOMA communication, in a scenario where user arrival rate is modeled using Poisson distribution with mean arrival rate of $\lambda=3$ users/code block time, and encoding each user's information bits with a common rate 1/9 LDPC FEC code. Each curve corresponds to a different information bit node degree, these being 2, 3, 4, and 5.

Referring to FIG. 5, the figure illustrates simulation results showing frame error rate performance provided by the modeled NOMA communication system, applying four different exemplary LDPC codes of rate 1/9, using a simultaneous user scenario of mean Poisson arrival rate λ=3 users/codeblock time, and information node bit degrees of 2, 3, 4, and 5. Frame error rate performance, for codes with information node bit degrees 2, 3, 4, and 5, respectively, is shown by plot lines 502, 503, 504, and 505.

Figure 6:
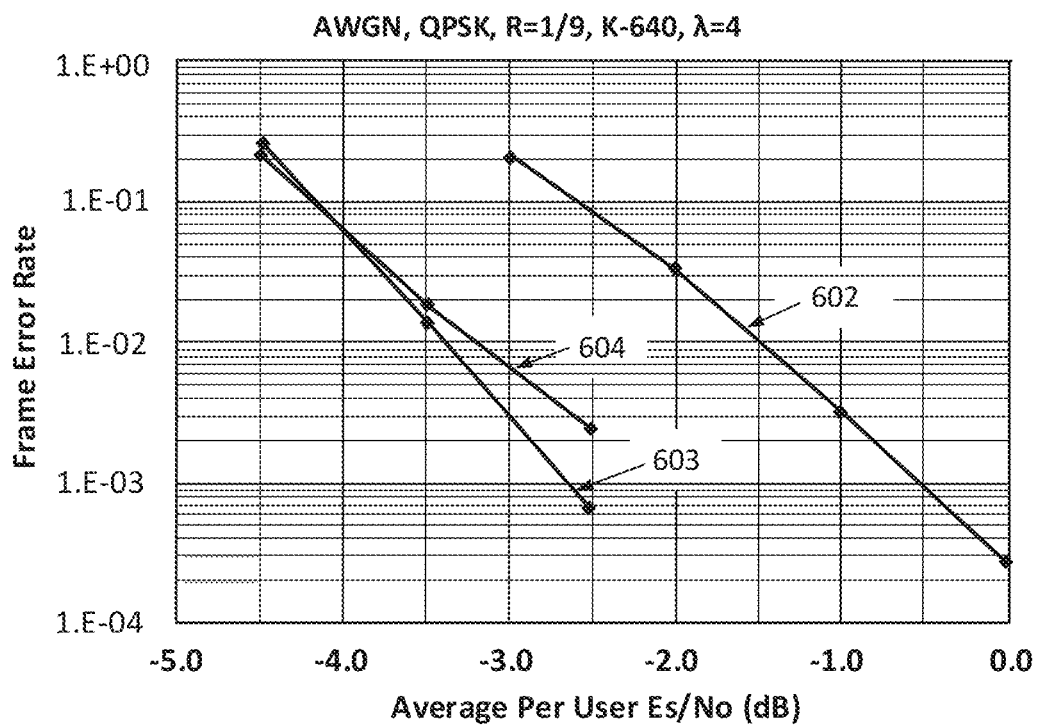
FIG. 6 illustrates a simulation result of a NOMA communication, in a scenario where user arrival rate is modeled using Poisson distribution with mean arrival rate of $\lambda=4$ users/code block time, and encoding each user's information bits with a common rate 1/9 LDPC FEC code. Each curve corresponds to a different information bit node degree, these being 2, 3, and 4.

FIG. 6 illustrates simulation results applying three different exemplary LDPC codes of rate 1/9, using a simultaneous user scenario of mean Poisson arrival rate λ=4 users/codeblock time, and information node bit degrees of 2, 3, and 4. Frame error rate performance, for codes with information node bit degrees 2, 3, and 4, respectively, is shown by plot lines 602, 603, and 604.

Figure 7:
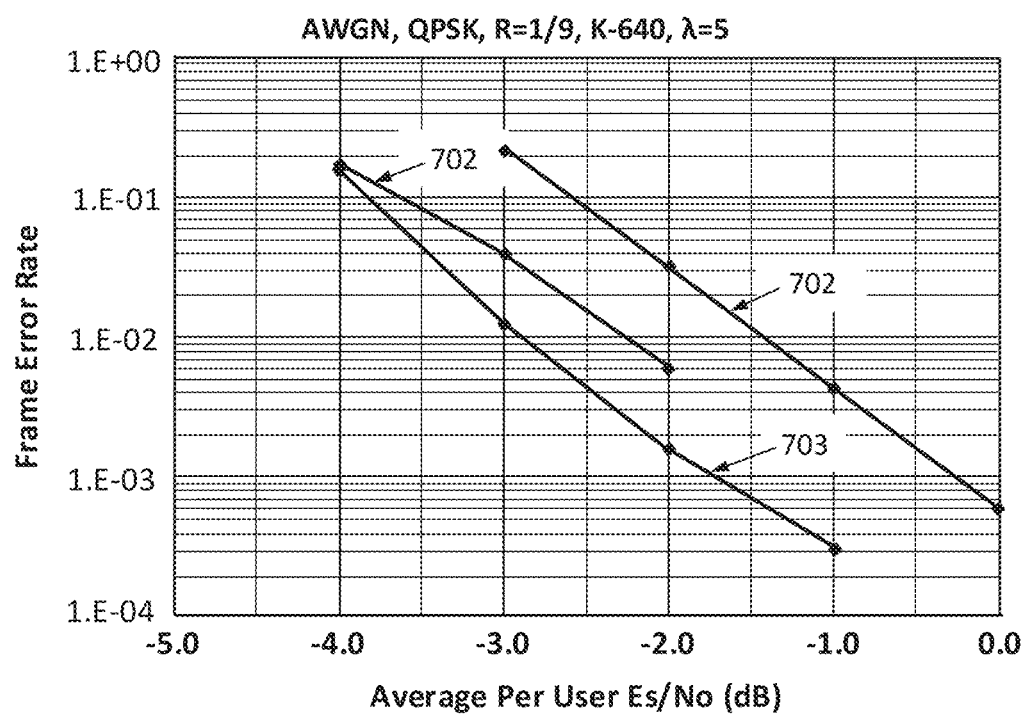
FIG. 7 illustrates a simulation result of a NOMA communication, in a scenario where user arrival rate is modeled using Poisson distribution with mean arrival rate of $\lambda=5$ users/code block time, and encoding each user's information bits with a common rate 1/9 LDPC FEC code. Each curve corresponds to a different information bit node degree, these being 2, 3, and 4.

FIG. 7 illustrates simulation results applying three different exemplary LDPC codes of rate 1/9, using a simultaneous user scenario of mean Poisson arrival rate λ=5 users/codeblock time, and information node bit degrees of 2, 3, and 4. Frame error rate performance, for codes with information node bit degrees 2, 3, and 4, respectively, is shown by plot lines 702, 703, and 704.

Figure 8:
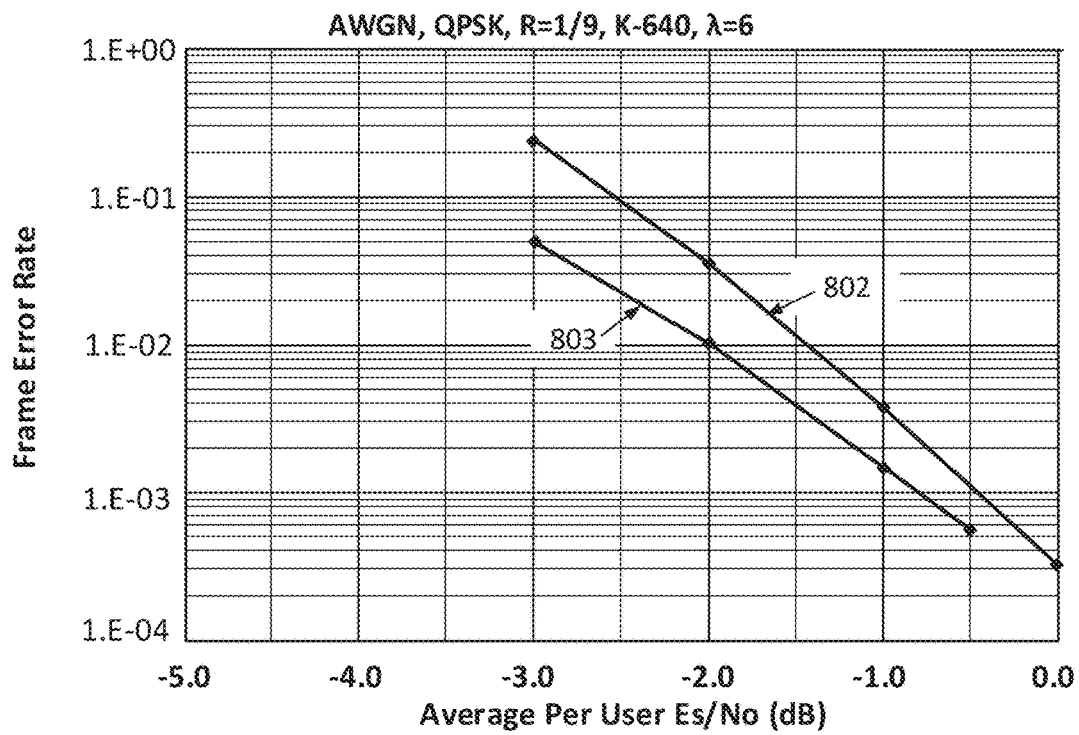
FIGS. 8, 9, and 10 illustrate simulation results of a NOMA communication, in a scenario where user arrival rate is modeled using Poisson distribution with mean arrival rate of $\lambda=6$, 7, and 8 users/code block time, respectively, and encoding each user's information bits with a common rate 1/9 LDPC FEC code. Each curve corresponds to a different information bit node degree, these being 2 and 3.

FIG. 8 illustrates simulation results applying two different exemplary LDPC codes of rate 1/9, in a simultaneous user scenario of mean Poisson arrival rate λ=6 users/codeblock time, with information node bit degrees of 2 and 3. Frame error rate performance is shown, respectively, by plot lines 802 and 803.

Figure 9:
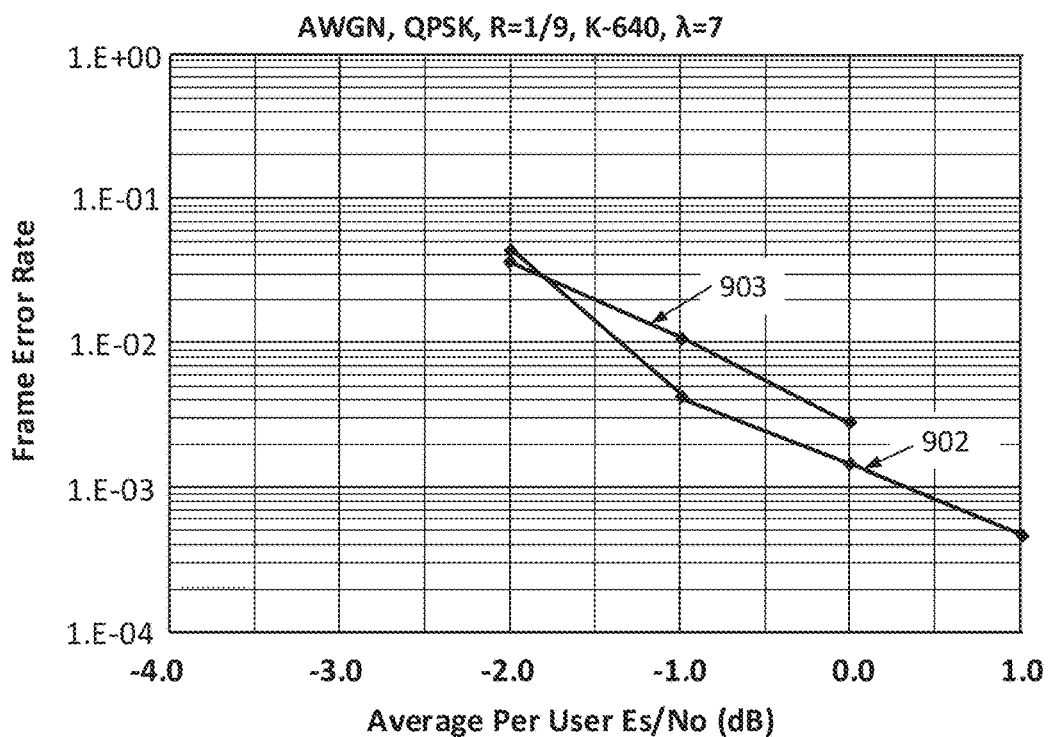

FIG. 9 illustrates simulation results applying two different exemplary LDPC codes of rate 1/9, in a simultaneous user scenario of mean Poisson arrival rate λ=7 users/codeblock time, with information node bit degrees of 2 and 3. Frame error rate performance is shown, respectively, by plot lines 902 and 903.

Figure 10:
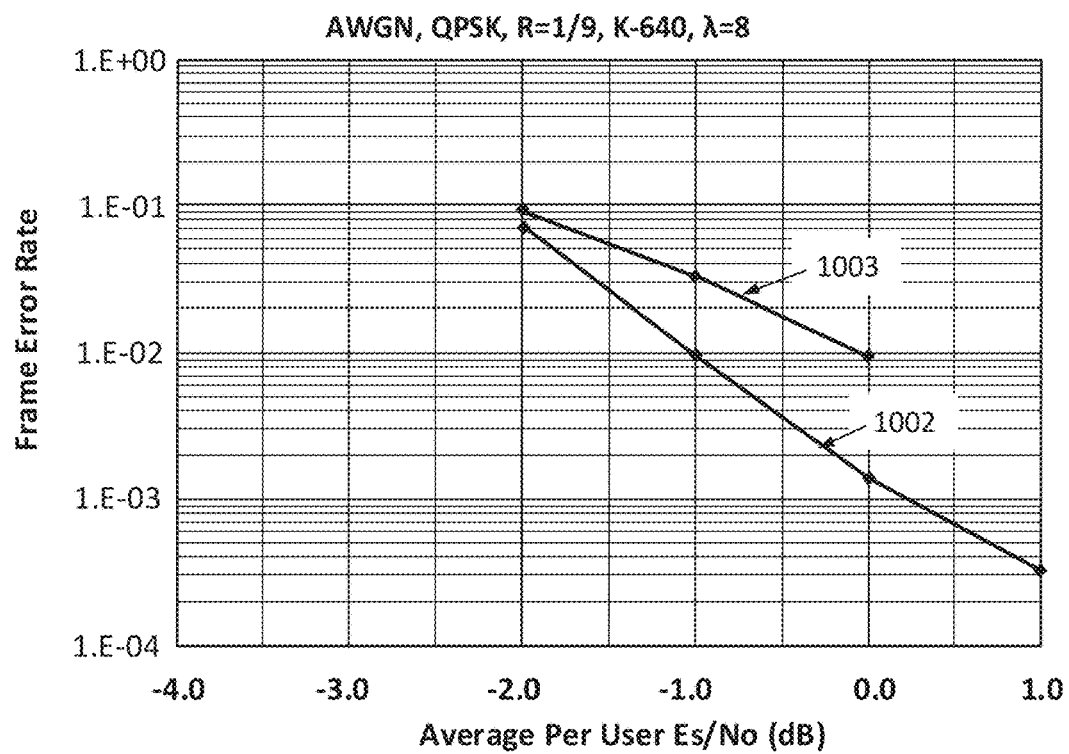

FIG. 10 illustrates simulation results applying two different exemplary LDPC codes of rate 1/9, in a simultaneous user scenario of mean Poisson arrival rate λ=8 users/codeblock time, with information node bit degrees of 2 and 3. Frame error rate performance is shown, respectively, by plot lines 1002 and 1003.

Figure 11:
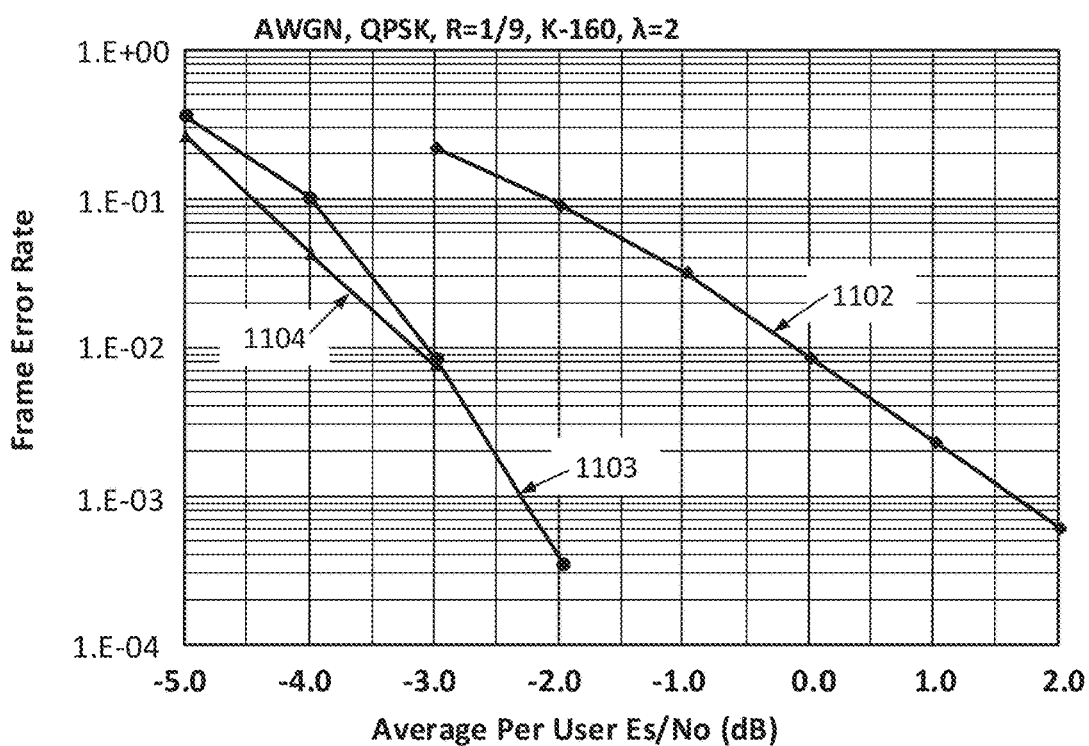
FIG. 11 illustrates a simulation result of a NOMA communication, in a scenario where user arrival rate is modeled using Poisson distribution with mean arrival rate of $\lambda=2$ users/code block time, and encoding each user's K information bits with a common rate 1/9 LDPC FEC code with smaller K than used in FIGS. 3-10. Each curve corresponds to a different information bit node degree, these being 2, 3, and 4.

FIG. 11 illustrates simulation results applying four different exemplary LDPC codes of rate 1/9, with a K value, i.e., a number of information bits per codeblock of 160 bits (as opposed to K=640 bits for FIGS. 4-10), in a simultaneous user scenario of mean Poisson arrival rate λ=2 users/codeblock time, with information node bit degrees of 2, 3, and 4. Frame error rate performance is shown, respectively, by plot lines 1102, 1103, and 1104.

Figure 12:
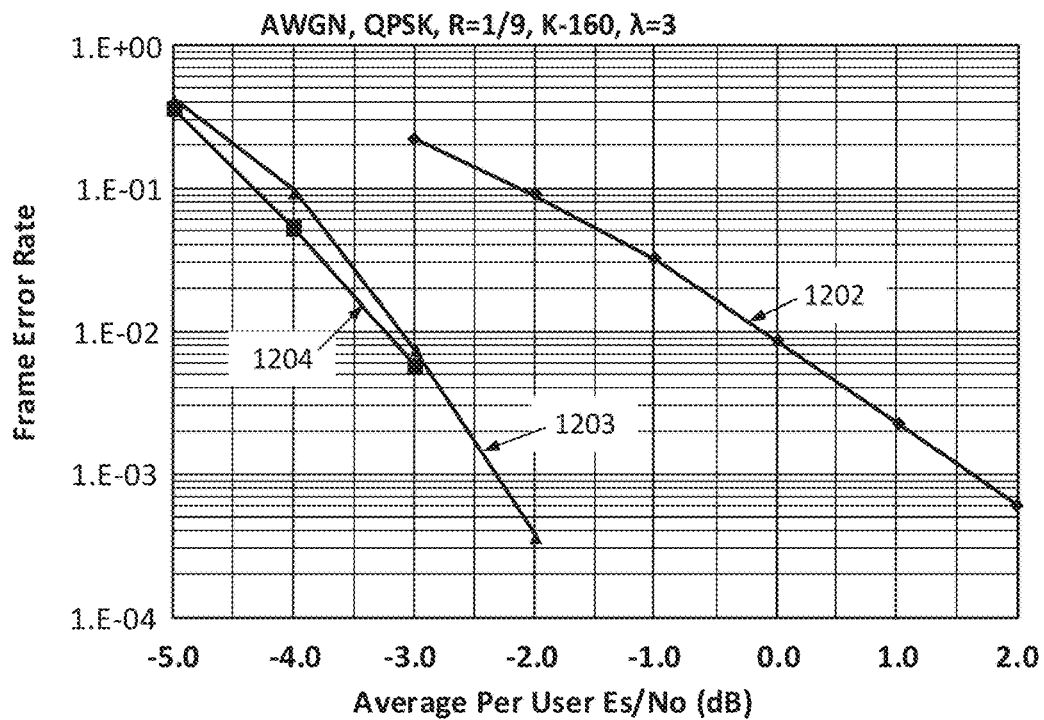
FIGS. 12 and 13 illustrate simulation results of a NOMA communication, in a scenario where user arrival rate is modeled using Poisson distribution with mean arrival rate of $\lambda=3$ and 4 users/code block time, respectively, and encoding each user's K information bits with a common rate 1/9 LDPC FEC code with smaller K than used in FIGS. 3-10. Each curve corresponds to a different information bit node degree, these being 2, 3, and 4.

FIG. 12 illustrates simulation results applying three different exemplary LDPC codes of rate 1/9, with K=160 bits, in a simultaneous user scenario of mean Poisson arrival rate λ=3 users/codeblock time, with information node bit degrees of 2, 3, and 4. Frame error rate performance is shown, respectively, by plot lines 1202, 1203, and 1204.

Figure 13:
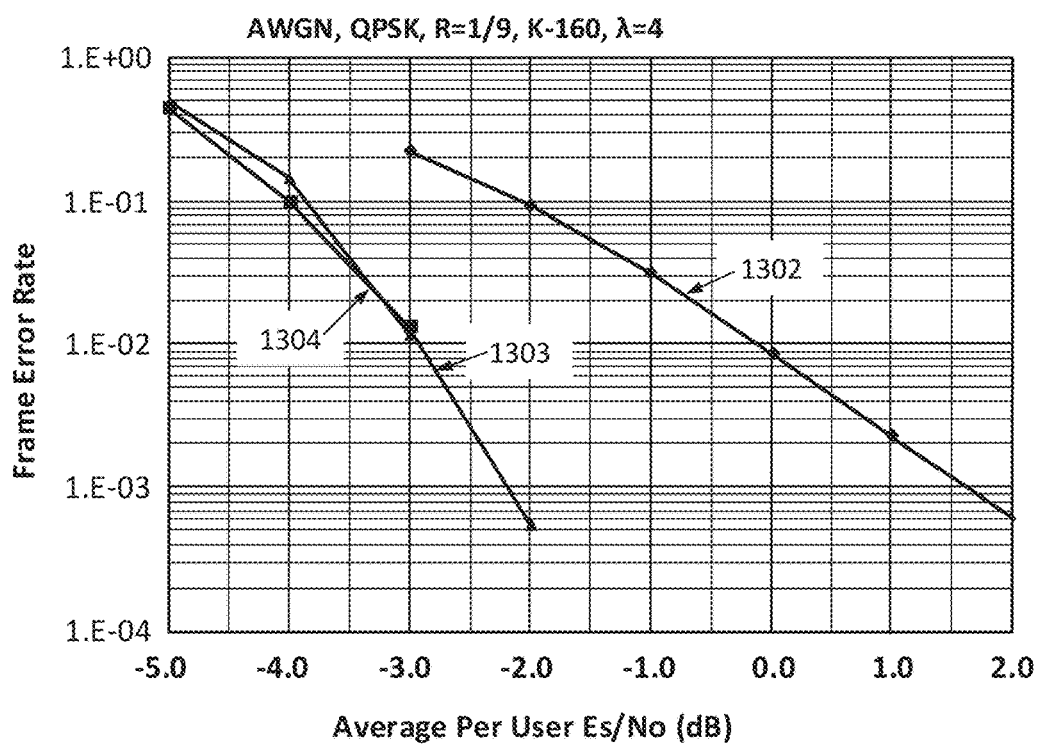

FIG. 13 illustrates simulation results applying three different exemplary LDPC codes of rate 1/9, with K=160 bits, in a simultaneous user scenario of mean Poisson arrival rate λ=4 users/codeblock time, with information node bit degrees of 2, 3, and 4. Frame error rate performance is shown, respectively, by plot lines 1302, 1303, and 1304.

Figure 14:
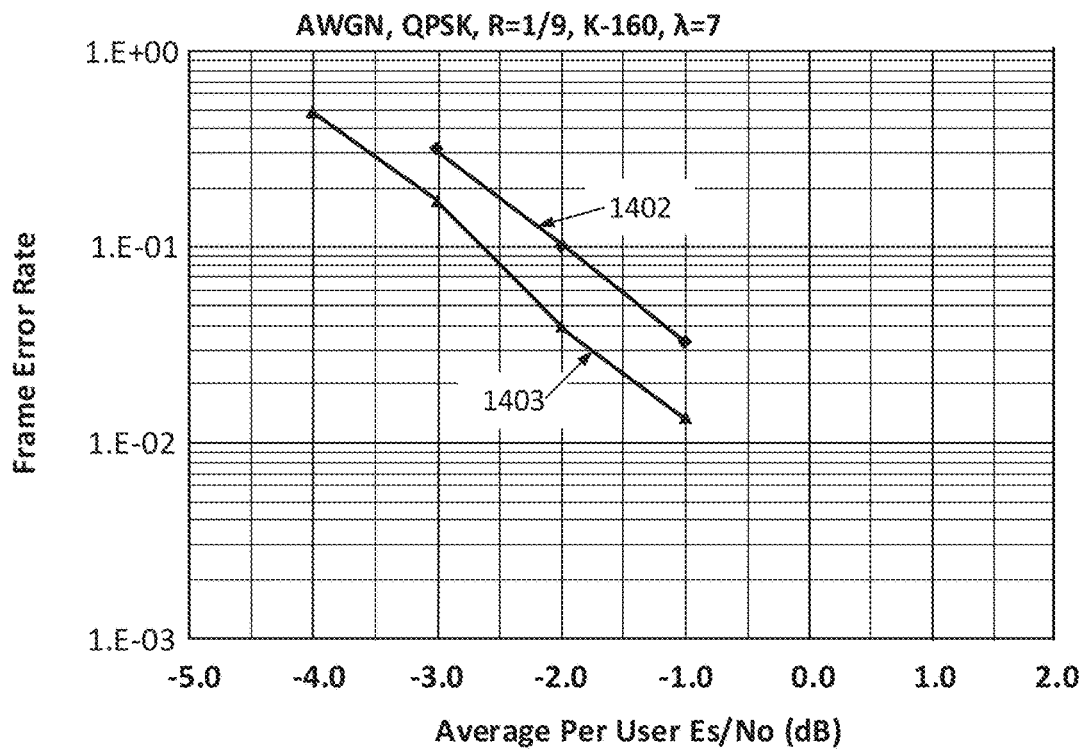
FIGS. 14-16 illustrate simulation results of a NOMA communication, in a scenario where user arrival rate is modeled using Poisson distribution with mean arrival rate of $\lambda=7$, 8, and 9 users/code block time, respectively, and encoding each user's K information bits with a common rate 1/9 LDPC FEC code with smaller K than used in FIGS. 3-10. Each curve corresponds to a different information bit node degree, these being 2 and 3.

FIG. 14 illustrates simulation results applying two different exemplary LDPC codes of rate 1/9, with K=160 bits, in a simultaneous user scenario of mean Poisson arrival rate λ=7 users/codeblock time, with information node bit degrees of 2 and 3. Frame error rate performance is shown, respectively, by plot lines 1402 and 1403.

Figure 15:
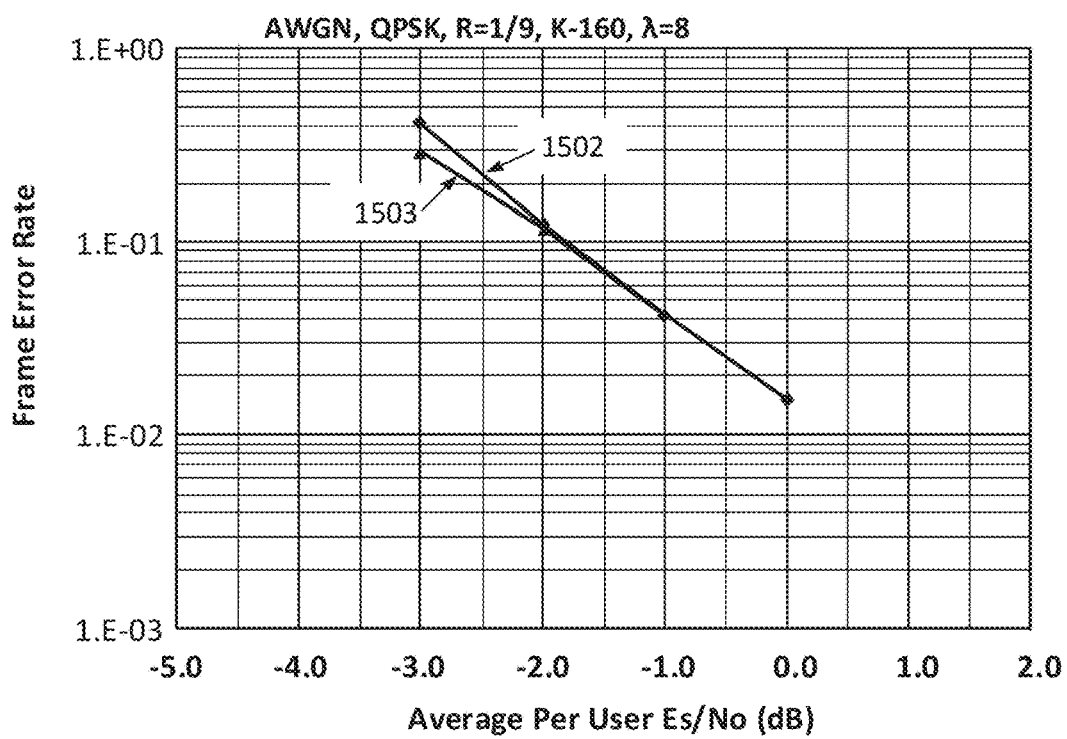

FIG. 15 illustrates simulation results applying two different exemplary LDPC codes of rate 1/9, with K=160 bits, in a simultaneous user scenario of mean Poisson arrival rate λ=8 users/codeblock time, with information node bit degrees of 2 and 3. Frame error rate performance is shown, respectively, by plot lines 1502 and 1503.

Figure 16:
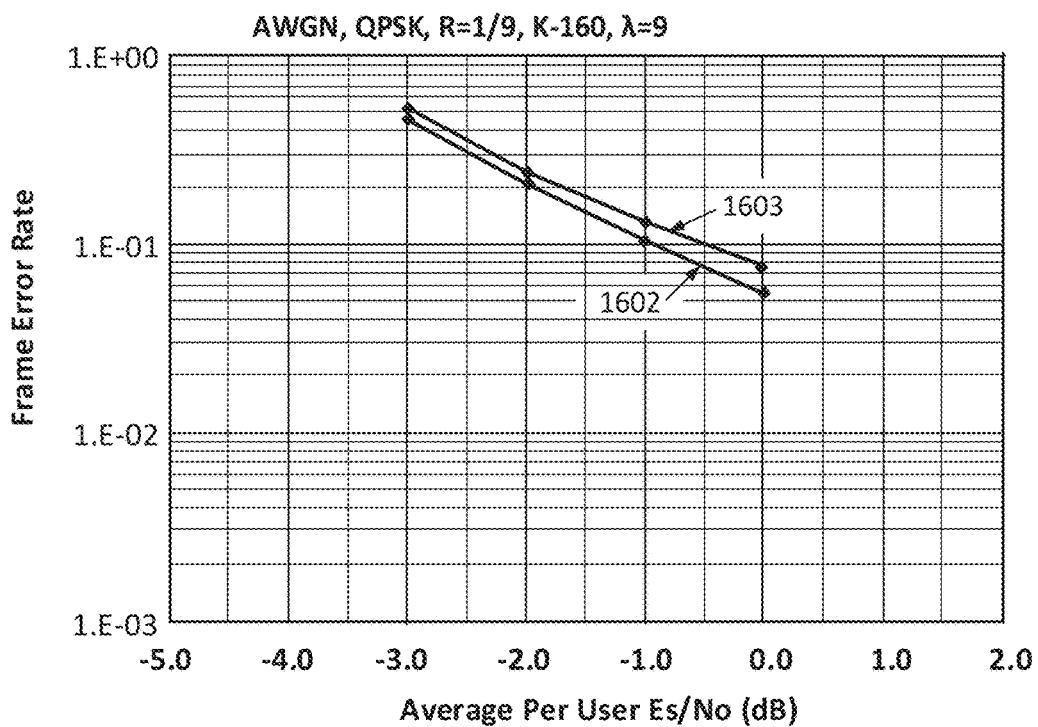

FIG. 16 illustrates simulation results applying two different exemplary LDPC codes of rate 1/9, with K=160 bits, in a simultaneous user scenario of mean Poisson arrival rate $\lambda$=9 users/codeblock time, with information node bit degrees of 2 and 3. Frame error rate performance is shown, respectively, by plot lines 1602 and 1603.

Figure 17:
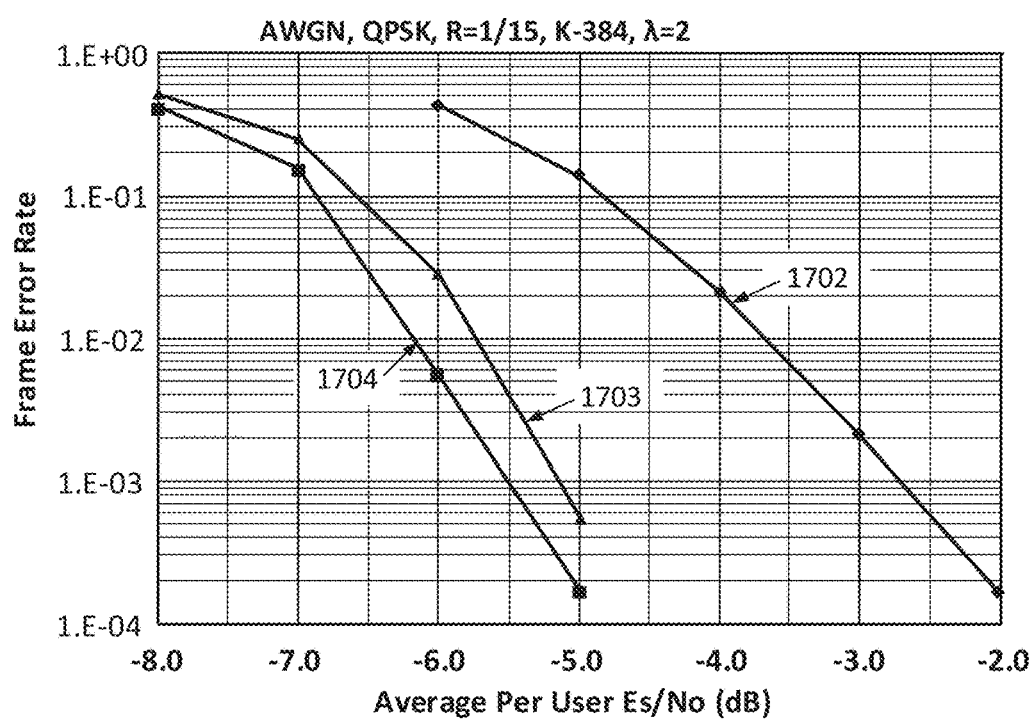
FIGS. 17, 18, and 19 illustrate simulation results of a NOMA communication, in a scenario where user arrival rate is modeled using Poisson distribution with mean arrival rate of $\lambda=2$, 6, and 9 users/code block time, respectively, and encoding each user's information bits with a common rate 1/15 LDPC FEC code. Each curve corresponds to a different information bit node degree, these being 2, 3, and 4.

FIG. 17 illustrates simulation results applying three different exemplary LDPC codes of rate 1/15, using a simultaneous user scenario of mean Poisson arrival rate $\lambda$=2 users/codeblock time, and information node bit degrees of 2, 3, and 4. Frame error rate performance, for codes with information node bit degrees 2, 3, and 4, respectively, is shown by plot lines 1702, 1703, and 1704.

Figure 18:
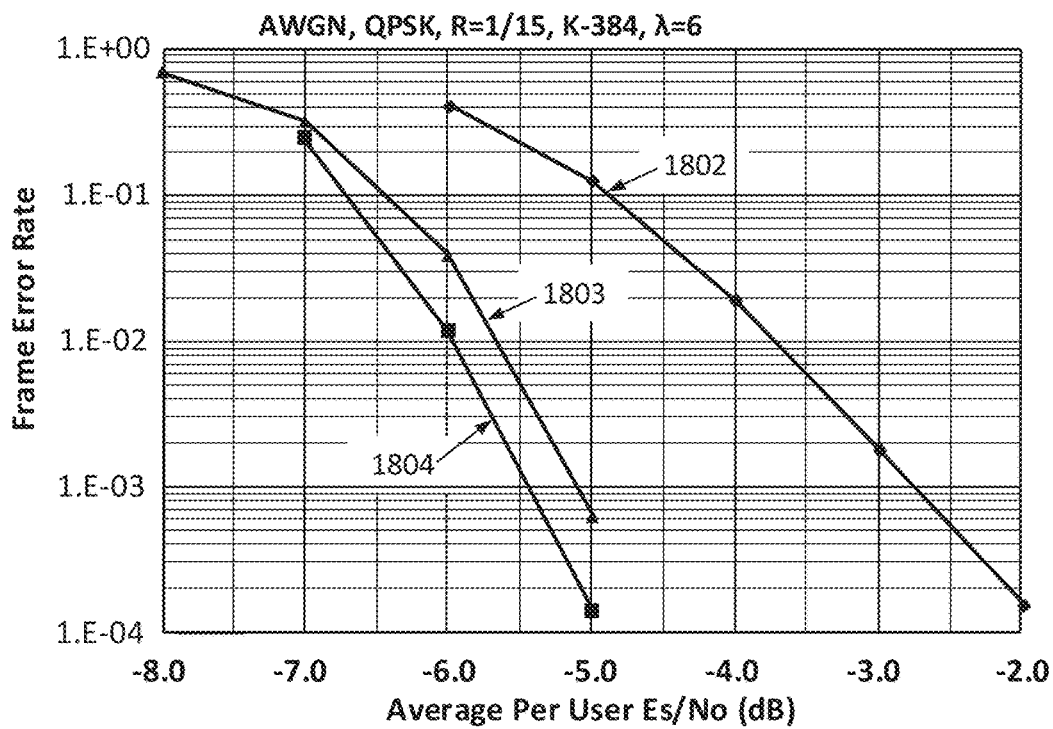

FIG. 18 illustrates simulation results applying three different rate 1/15 LDPC codes, using a simultaneous user scenario of mean Poisson arrival rate $\lambda$=6 users/codeblock time, and information node bit degrees of 2, 3, and 4. Frame error rate performance, for codes with information node bit degrees 2, 3, and 4, respectively, is shown by plot lines 1802, 1803, 1804.

Figure 19:
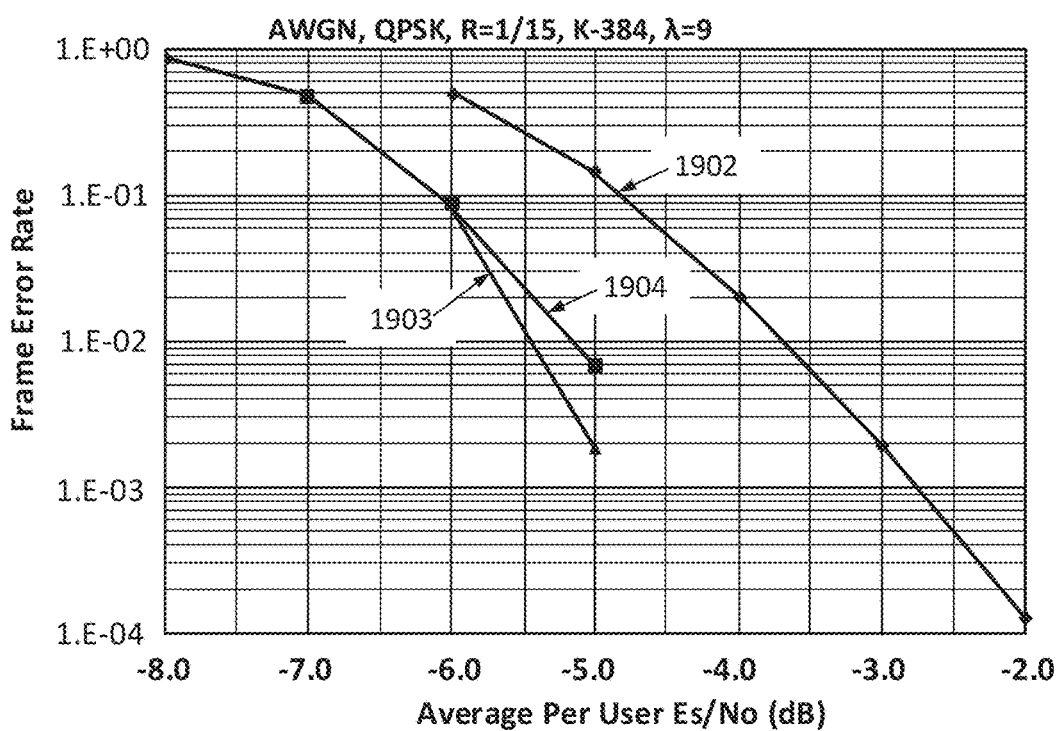

FIG. 19 illustrates simulation results applying three different rate 1/15 LDPC codes, using a simultaneous user scenario of mean Poisson arrival rate $\lambda$=9 users/codeblock time, and information node bit degrees of 2, 3, and 4. Frame error rate performance, for codes with information node bit degrees 2, 3, and 4, respectively, is shown by plot lines 1902, 1903, 1904.

Figure 20:
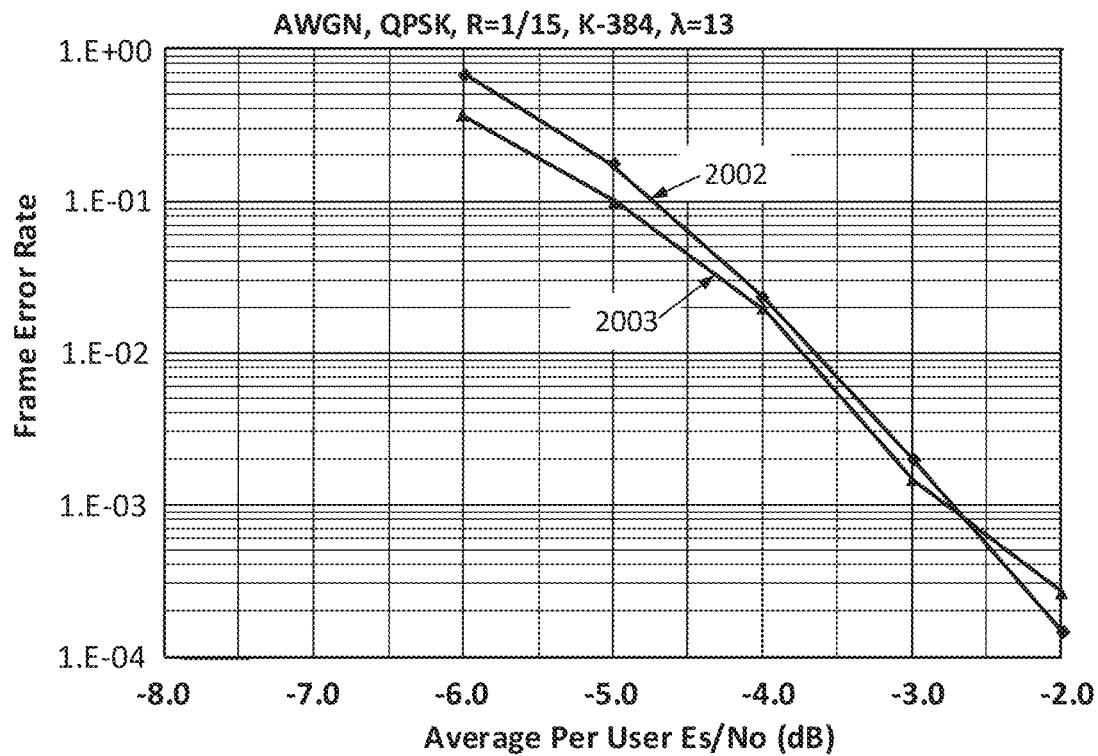
FIGS. 20 and 21 illustrate simulation results of a NOMA communication, in a scenario where user arrival rate is modeled using Poisson distribution with mean arrival rate of $\lambda=13$ and 14 users/code block time, respectively, and encoding each user's information bits with a common rate 1/15

FIG. 20 illustrates simulation results applying two different rate 1/15 LDPC codes, using a simultaneous user scenario of mean Poisson arrival rate $\lambda$=13 users/codeblock time, and information node bit degrees of 2 and 3. Frame error rate performance, for codes with information node bit degrees 2 and 3, respectively, is shown by plot lines 2002 and 2003.

Figure 21:
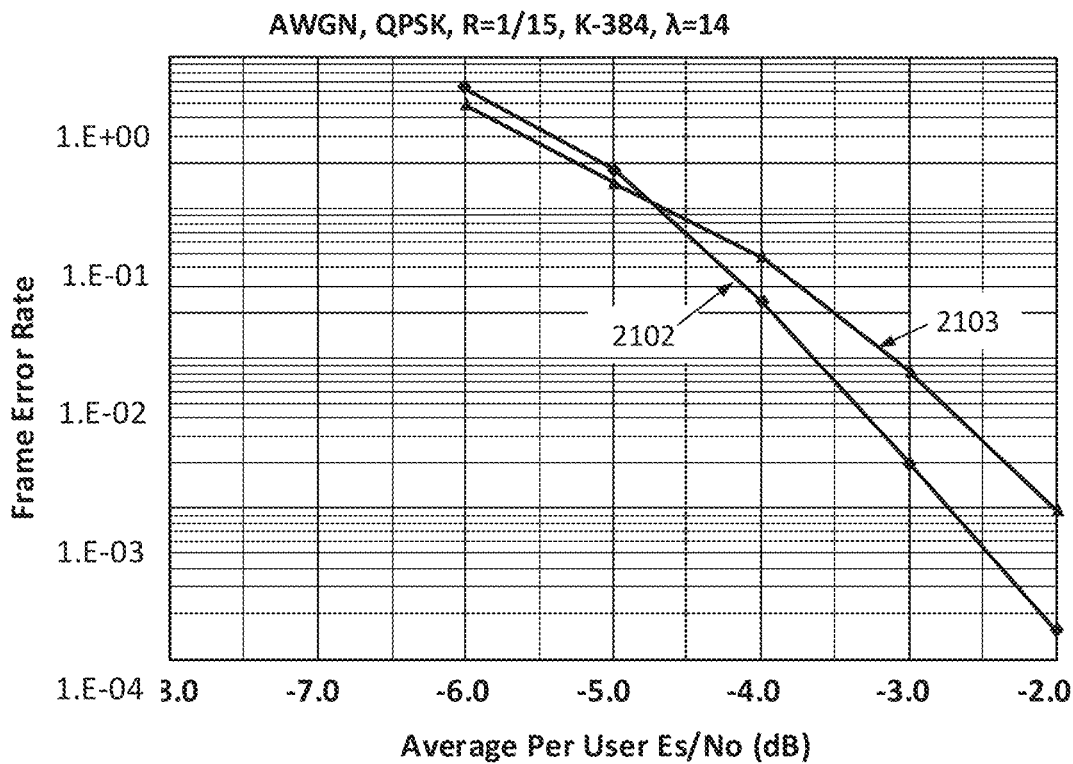

FIG. 21 illustrates simulation results applying two different rate 1/15 LDPC codes, using a simultaneous user scenario of mean Poisson arrival rate $\lambda$=14 users/codeblock time, and information node bit degrees of 2 and 3. Frame error rate performance, for codes with information node bit degrees 2 and 3, respectively, is shown by plot lines 2102 and 2103.

FIG. 22 illustrates simulation results applying three different rate 1/8 LDPC codes, using a simultaneous user scenario of mean Poisson arrival rate $\lambda$=2 users/codeblock time, and information node bit degrees of 2, 3, and 4. Frame error rate performance, for codes with information node bit degrees 2, 3, and 4, respectively, is shown by plot lines 2202, 2203, 2204.

FIG. 23 illustrates simulation results applying three different rate 1/8 LDPC codes, using a simultaneous user scenario of mean Poisson arrival rate $\lambda$=3 users/codeblock time, and information node bit degrees of 2, 3, and 4. Frame error rate performance, for codes with information node bit degrees 2, 3, and 4, respectively, is shown by plot lines 2302, 2303, 2304.

FIG. 24 illustrates simulation results applying three different rate 1/8 LDPC codes, using a simultaneous user scenario of mean Poisson arrival rate $\lambda$=4 users/codeblock time, and information node bit degrees of 2, 3, and 4. Frame error rate performance, for codes with information node bit degrees 2, 3, and 4, respectively, is shown by plot lines 2402, 2403, 2404.

FIG. 25 illustrates simulation results applying two different rate 1/8 LDPC codes, using a simultaneous user scenario of mean Poisson arrival rate $\lambda$=5 users/codeblock time, and information node bit degrees of 2 and 3. Frame error rate performance, for codes with information node bit degrees 2 and 3, respectively, is shown by plot lines 2502 and 2503.

FIG. 26 illustrates simulation results applying two different rate 1/8 LDPC codes, using a simultaneous user scenario of mean Poisson arrival rate $\lambda$=6 users/codeblock time, and information node bit degrees of 2 and 3. Frame error rate performance, for codes with information node bit degrees 2 and 3, respectively, is shown by plot lines 2602 and 2603.

FIG. 27 illustrates simulation results applying two different rate 1/8 LDPC codes, using a simultaneous user scenario of mean Poisson arrival rate $\lambda$=7 users/codeblock time, and information node bit degrees of 2 and 3. Frame error rate performance, for codes with information node bit degrees 2 and 3, respectively, is shown by plot lines 2702 and 2703.

FIG. 28 illustrates simulation results applying two different rate 1/6 LDPC codes, using a simultaneous user scenario of mean Poisson arrival rate $\lambda$=2 users/codeblock time, and information node bit degrees of 2 and 3. Frame error rate performance, for codes with information node bit degrees 2 and 3, respectively, is shown by plot lines 2802 and 2803.

FIG. 29 illustrates simulation results applying two different rate 1/6 LDPC codes, using a simultaneous user scenario of mean Poisson arrival rate $\lambda$=3 users/codeblock time, and information node bit degrees of 2 and 3. Frame error rate performance, for codes with information node bit degrees 2 and 3, respectively, is shown by plot lines 2902 and 2903.

FIG. 30 illustrates simulation results applying two different rate 1/6 LDPC codes, using a simultaneous user scenario of mean Poisson arrival rate $\lambda$=4 users/codeblock time, and information node bit degrees of 2 and 3. Frame error rate performance, for codes with information node bit degrees 2 and 3, respectively, is shown by plot lines 3002 and 3003.

Figure 31:
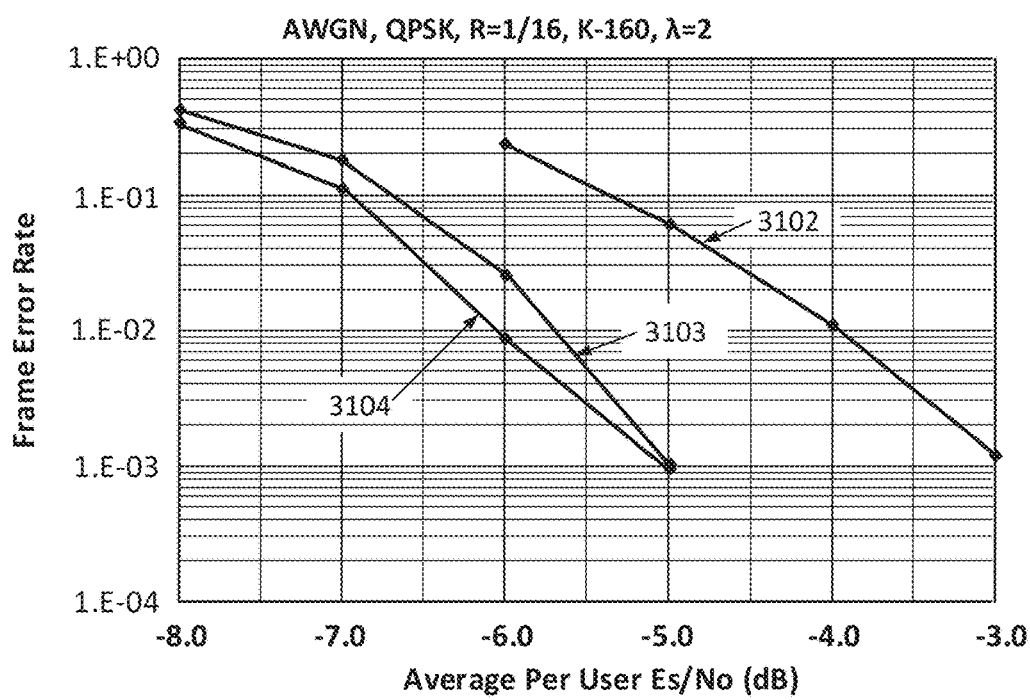

FIG. 31 illustrates simulation results applying three different rate 1/6 LDPC codes, using a simultaneous user scenario of mean Poisson arrival rate $\lambda$=2 users/codeblock time, and information node bit degrees of 2, 3, and 4. Frame error rate performance, for codes with information node bit degrees 2, 3, and 4, respectively, is shown by plot lines 3102, 3103, 3104.

Figure 32:
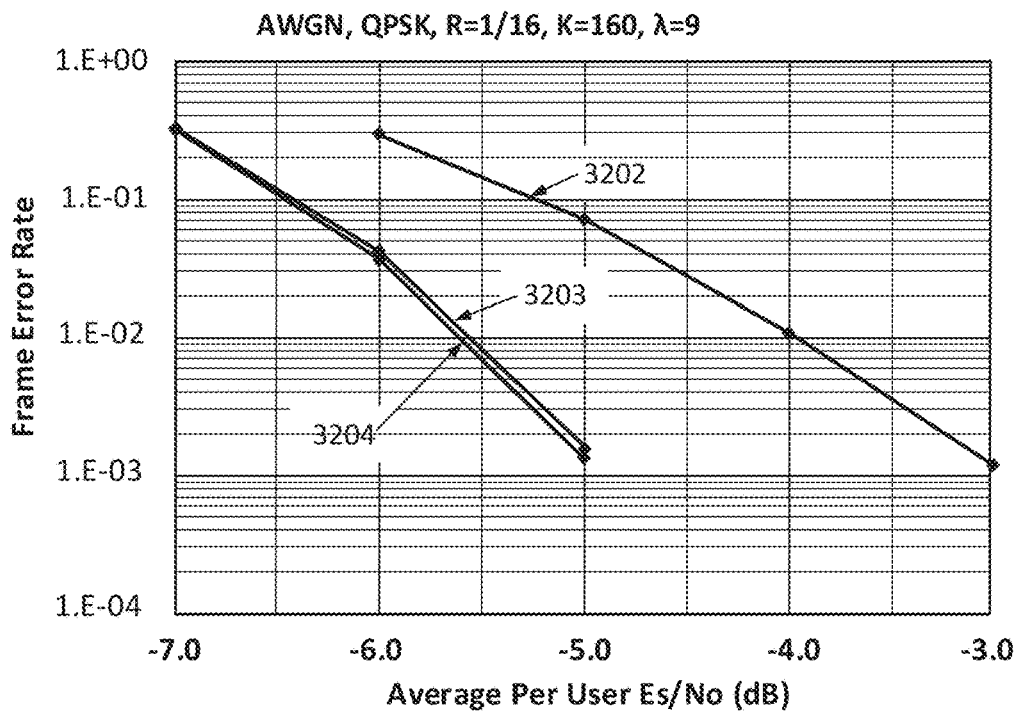

FIG. 32 illustrates simulation results applying three different rate 1/16 LDPC codes, using a simultaneous user scenario of mean Poisson arrival rate $\lambda$=9 users/codeblock time, and information node bit degrees of 2, 3, and 4. Frame error rate performance, for codes with information node bit degrees 2, 3, and 4, respectively, is shown by plot lines 3202, 3203, 3204.

Figure 33:
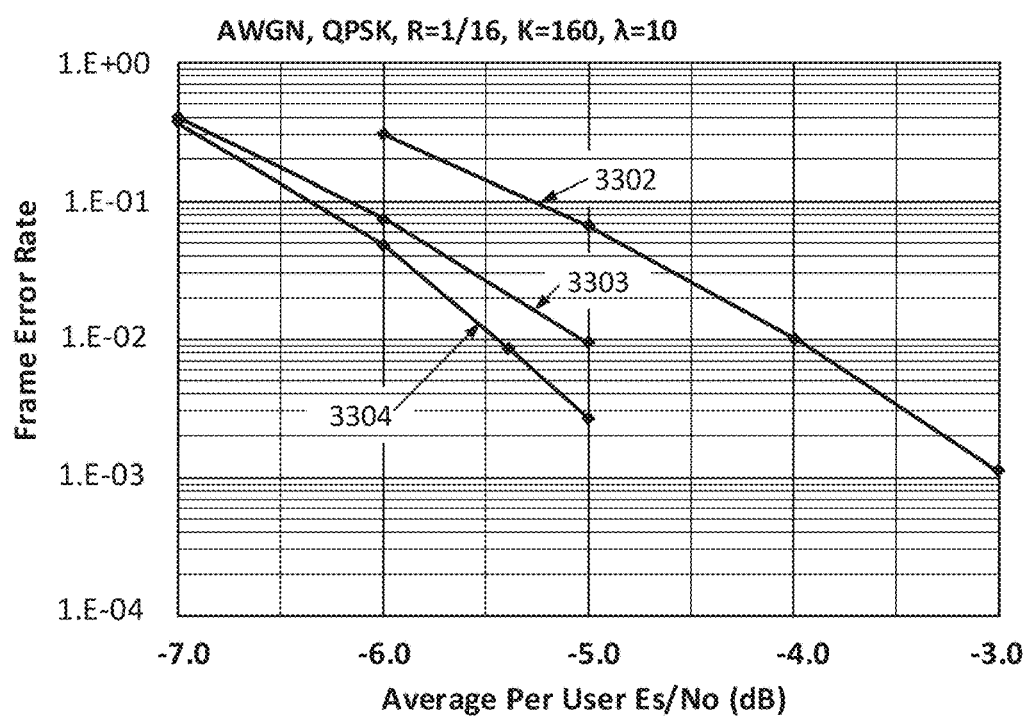

FIG. 33 illustrates simulation results applying three different rate 1/16 LDPC codes, using a simultaneous user scenario of mean Poisson arrival rate $\lambda$=10 users/codeblock time, and information node bit degrees of 2, 3, and 4. Frame error rate performance, for codes with information node bit degrees 2, 3, and 4, respectively, is shown by plot lines 3302, 3303, 3304.

Figure 34:
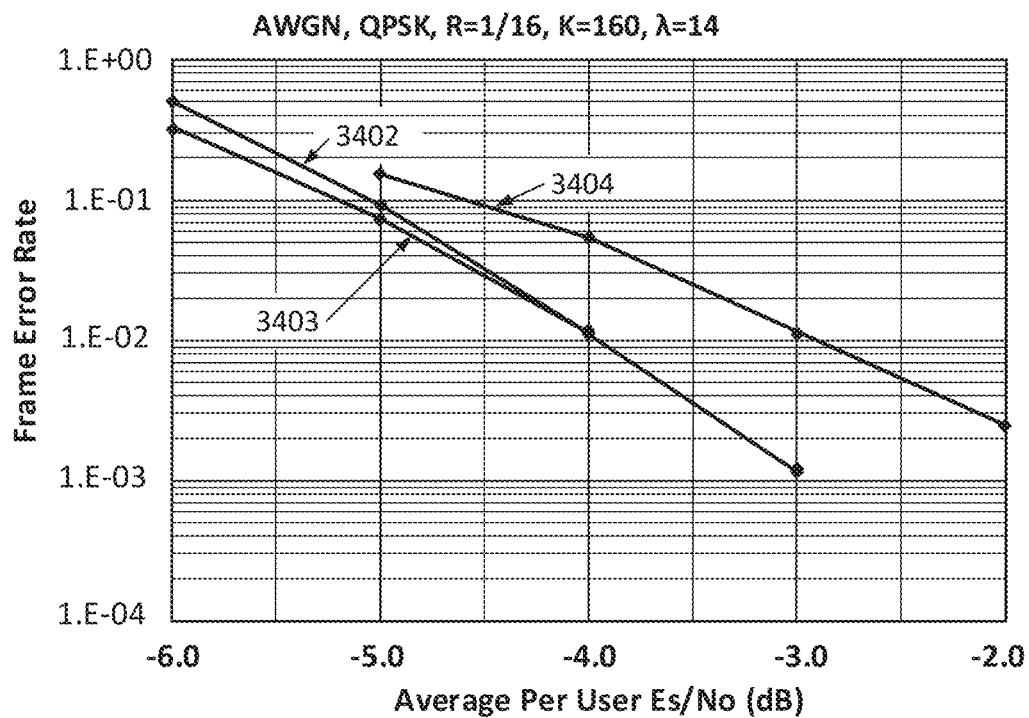

FIG. 34 illustrates simulation results applying three different rate 1/16 LDPC codes, using a simultaneous user scenario of mean Poisson arrival rate $\lambda$=14 users/codeblock time, and information node bit degrees of 2, 3, and 4. Frame error rate performance, for codes with information node bit degrees 2, 3, and 4, respectively, is shown by plot lines 3402, 3403, 3404.

FIG. 35 illustrates simulation results applying two different rate 1/16 LDPC codes, using a simultaneous user scenario of mean Poisson arrival rate $\lambda$=15 users/codeblock time, and information node bit degrees of 2 and 3. Frame error rate performance, for codes with information node bit degrees 2 and 3, respectively, is shown by plot lines 3502 and 3503.

FIG. 36 illustrates an example satellite network system 3600 (hereinafter "system 3600") in which various aspects of the present disclosure may be implemented. The system 3600 can be configured of a bent pipe very small aperture terminal (VSAT) satellite network, and can include a satellite gateway (SGW) 3602, an arbitrary number M of remote VSAT terminals 3604-1, 3604-2, . . . 3604M (collectively "VSATs 3604"), a satellite 3606, a number N of Internet protocol gateways (IPGWs) 3608-1, 3608-2, . . . 3608-N (collectively "IPGWs 3608"), and a radio frequency (RF) terminal 3610.

SGW 3602 may be connected to remote terminals, such as the example VSATs 3604, via forward uplink 3612 for carrying data from SGW 3602 to the satellite 3606, and forward downlink 3614 for carrying data from the satellite 3606 to the VSATs 3604. VSATs 3604 can be configured to transmit, via return uplink 3616, data to the satellite 3606, for transmission, via return downlink 3618, to SGW 3602. SGW 3602 may be part of satellite earth stations with connectivity to ground telecommunications infrastructure. RF terminal 3610 may be the physical equipment responsible for sending and receiving signals to and from satellite 3606, and may provide air interfaces for the SGW 3602. In various implementations, a bandwidth manager 3620 can be included to manage or coordinate bandwidth allocation on the shared network.

Satellite 3606 may be any suitable communications satellite. Signals through satellite 3606 in the forward direction may, for example, be according to the DVB-S2x standard. Signals passing through satellite 3606 in the return direction may be based, for example, on the IPoS standard. Other suitable signal types may also be used in either direction.

The bandwidth of RF terminal 3610 can be shared amongst IPGWs 3608. At each of the IPGWs 3608 traffic flows may be classified into different priorities, and may be processed and multiplexed before being forwarded to priority queues (not visible in FIG. 31). Data from, for example the Internet, and intended for remote terminals 3604 may be in the form of IP packets, including TCP packets and UDP packets, or any other suitable IP packets. This data may enter SGW 3602 from any one of IPGWs 3608. The received IP packets may be processed and multiplexed by SGW 3602 along with IP packets from other ones of the IPGWs 3608. The IP packets may then be transmitted to satellite 3606, e.g., over forward uplink 3612, and from satellite 3606 to the VSATs 3604, e.g., as IP packets over forward downlink 3614. In an implementation, IP packets (or data configured according to various other protocols) may enter the network via the VSATs 3604, be processed by the VSATs, and transmitted to satellite 3606 over return uplink 3616, and then transmitted from the satellite 3606 to SGW 3602 over the return down link 3618.

Implementations of the system 3600 can also include or adapt a VSAT system such as illustrated in FIG. 1 of U.S. Pat. App. Pub. No. 2016/0036518, filed Oct. 12, 2015, the entirety of which is hereby incorporated by reference. Another example can include or adapt a VSAT system such as illustrated in FIG. 1B of U.S. Pat. App. Pub. No. 2016/0094467, filed Sep. 25, 2015, the entirety of which is hereby incorporated by reference. Another example can include or adapt a VSAT system such as illustrated in FIG. 1 of U.S. Pat. App. Pub. No. 2014/0169167, filed Feb. 21, 2014, the entirety of which is hereby incorporated by reference. It will be understood that these are only examples within a larger range of VSAT architectures and configurations that can be included and/or adapted to implement the system 3600.

In an implementation, each of the VSATs 3604 can include one or more transmission devices, as represented by items 3622-1, 3622-2, . . . 3622-M (collectively "transmission devices 3622") that can be configured according to the FIG. 1 transmission apparatuses 106. In other words, each of the transmission devices 3622 can include an instance of an optimized BNG LDPC FEC encoder, such as the FIG. 1 optimized BNG FEC encoder 108, configured to encode each K-bit SC bit blocks input to one of the VSATs 3604 into an N-bit FEC encoded block, using an optimized FEC coding generator selected in accordance with, and as being optimal for, $\lambda$ simultaneously transmitting ones of the VSATs 3104, using the same time and frequency space on the return uplink 3616.

Also, in an implementation, each of the VSATs 3604 can include one or more receiver devices, as represented by items 3624-1, 3624-2, . . . 3624-M (collectively "receiver devices 3624"), and each of the receiver devices 3624 can be configured according to the FIG. 1 receiver portion 104, each being positioned with, or otherwise associated with a corresponding one of the VSATs 3604.

FIG. 37 is a block diagram illustrating a computer system 3700 upon which aspects of this disclosure may be implemented, such as, but not limited to, particular logic blocks described in reference to FIG. 1. It will be understood that logic blocks illustrated in FIG. 37 represent functions, and do not necessarily correspond to particular hardware on a one-to-one basis. The computer system 3700 can include a data processor 3702, instruction memory 3204, and a general purpose memory 3706, coupled by a bus 3708.

The instruction memory 3706 can include a tangible medium retrievably storing computer-readable instructions, that when executed by the data processor 3702 cause the processor to perform operations, such as described in reference to FIG. 1.

The computer system 3700 can also include a communications interface 3710, configured to interface with a local network 3712 for accessing a local server 3714, and to communicate through an Internet service provider (ISP) 3716 to the Internet 3718, and access a remote server 3720. The computer system 3700 can also include a display 3722 and a user interface 3724, such as a touchscreen or keypad.

The term "machine-readable medium" as used herein refers to any medium that participates in providing data that causes a machine to operation in a specific fashion. Forms of machine-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracing of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that terms and expressions used herein have the ordinary meaning accorded to such terms and expressions in their respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," and any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that comprises the element.

In the foregoing Detailed Description, it can be seen that various features are grouped together in various examples for the purpose of streamlining the disclosure. This method of disclosure is not to be interpreted as reflecting an intention that any summary recitation requires more features than its expressly recites. The following summary paragraphs form a portion of this disclosure.

What is claimed is:

1. A system for optimizing forward error correction (FEC) code for interfering users in a multiple access communication, the system comprising:
    a transmitter apparatus, associated with one of the interfering users, the transmitter apparatus including:
        a controller configured to receive an FEC code optimization information, switchable between at least a first value and a second value, to select a first optimized FEC code based at least in part on the first value, and select a second optimized FEC code based at least in part on the second value,
        a forward error correction (FEC) encoder configured to receive a source bit stream, and encode bits of the source bit stream according to the selected optimized FEC code, and output a series of FEC encoded bits, wherein:
            a parity check matrix of the first optimized FEC code has a first average information bit node degree, and a parity check matrix of the second optimized FEC code has a second average information bit node degree, and
            the first optimized FEC code has an FEC rate, and the second optimized FEC code has the FEC rate.

2. The system of claim 1, wherein:
    the controller is further configured to receive, as the FEC code optimization information, an information indicating a target average number of interfering users, the first value indicating a first target average number, and the second value indicating a second target average number, and
    the controller is further configured to select between at least the first optimized FEC code and the second optimized FEC code based, at least in part, on a product of the FEC rate and the target average number of users.

3. The system of claim 2, wherein:
    the parity check matrix of the first optimized FEC code has a first constant information bit node degree, the first constant information bit node degree being the first average information bit node degree, and
    the parity check matrix of the second optimized FEC code has a second constant information bit node degree, the second constant information bit node degree being the second average information bit node degree.

4. The system of claim 3, wherein:
    the selected FEC code has a constant information bit node degree of 2 when the product of the FEC code rate and the target average number of users is 0.9 or higher.

5. The system of claim 2, wherein:
    the controller is further configured to detect an average number of interfering users and:
        upon the product of the detected average number of interfering users and the FEC code rate being within the first range, to automatically select the first optimized FEC code, and
        upon the product of the detected average number of interfering users and the FEC code rate being within the second range, to automatically select the second optimized FEC code.

6. The system of claim 2, wherein,
    the controller is further configured to select the first optimized FEC code based, at least in part, on the product of the FEC rate and the target average number of users being within a first range, and to select the second optimized FEC code based, at least in part, on the product of the FEC rate and the target average number of users being within a second range, and
    a relation of the product of the target average number of users and the optimized FEC code rate to the first range and to the second range is according to the table below, where $\lambda$ is the target average number of interfering users, R is the FEC code rate and R is equal to 1/6:

| Range (R × $\lambda$) | Optimized FEC Code | Information Bit Node Degree of Optimized FEC Code |
|---|---|---|
| First, less than 0.6 | First Optimized FEC Code | 3 |
| Second, greater or equal to 0.6 | Second Optimized FEC Code. | 2 |

7. The system of claim 2, wherein:
the FEC code optimization information is further switchable between at least the first value, the second value and a third value,
the controller is further configured to select a third optimized FEC code, having a third information bit node degree, based at least in part on a product of the FEC code rate and the target average number of users being within a third range, and
the information bit node degree of the first optimized FEC code, the second optimized FEC code, and the third optimized FEC code, respectively, and a relation of the product of the target average number of users and the FEC code rate to the first range, the second range, and the third range is according to the table below, where $\lambda$ is the target average number of interfering users, R is the FEC code rate and R is equal to 1/8:

| Range (R × $\lambda$) | Optimized FEC Code | Information Bit Node Degree of Optimized FEC Code |
|---|---|---|
| First, less than 0.3 | First Optimized FEC Code | 4 |
| Second, between 0.3 and 0.7 | Second Optimized FEC Code | 3 |
| Third, more than 0.7 | Third Optimized FEC Code. | 2 |

8. The system of claim 2, wherein:
the FEC code selection information is further switchable between at least the first value, the second value and a third value,
the controller is further configured to select a third optimized FEC code, based at least in part on a product of the FEC code rate and the target average number of users being within a third range, and
a relation of the product of the target average number of users and the FEC code rate to the first range, the second range, and the third range is according to the table below, where $\lambda$ is the target average number of interfering users, R is the FEC code rate and R is equal to 1/9:

| Range (R × $\lambda$) | Optimized FEC Code | Information Bit Node Degree of Optimized FEC Code |
|---|---|---|
| First, less than 0.3 | First Optimized FEC Code | 4 |
| Second, between 0.3 and 0.8 | Second Optimized FEC Code | 3 |
| Third, more than 0.8 | Third Optimized FEC Code. | 2 |

9. The system of claim 2, wherein:
the FEC code selection information is further switchable between at least the first value, the second value and a third value,
the controller is further configured to select a third optimized FEC code, based at least in part on a product of the FEC code rate and the target average number of users being within a third range, and
a relation of the product of the target average number of users and the FEC code rate to the first range, the second range, and the third range is according to the table below, where $\lambda$ is the target average number of interfering users, R is the FEC code rate and R is equal to 1/15:

| Range (R × $\lambda$) | Optimized FEC Code | Information Bit Node Degree of Optimized FEC Code |
|---|---|---|
| First, less than 0.5 | First Optimized FEC Code | 4 |
| Second, between 0.5 and 0.9 | Second Optimized FEC Code | 3 |
| Third, more than 0.9 | Third Optimized FEC Code. | 2 |

10. The system of claim 2, wherein:
the FEC code selection information is further switchable between at least the first value, the second value and a third value,
the controller is further configured to select a third optimized FEC code, based at least in part on a product of the FEC code rate and the target average number of users being within a third range, and
a relation of the product of the target average number of users and the FEC code rate to the first range, the second range, and the third range is according to the table below, where $\lambda$ is the target average number of interfering users, R is the FEC code rate and R is equal to 1/16:

| Range (R × $\lambda$) | Optimized FEC Code | Information Bit Node Degree of Optimized FEC Code |
|---|---|---|
| less than 0.55 | First Optimized FEC Code | 4 |
| between 0.55 and 0.9 | Second Optimized FEC Code | 3 |
| more than 0.9 | Third Optimized FEC Code. | 2 |

11. A method for optimizing forward error correction (FEC) code for interfering users in a multiple access communication, the method comprising:
receiving an FEC code optimization information, switchable between at least a first value and a second value, and
selecting a first FEC code based at least in part on the FEC code optimization information being at the first value, and
selecting a second FEC code based at least in part on the FEC code optimization information being at the second value; and
receiving a source bit stream, and encoding bits of the source bit stream according to the selected optimized FEC code into a series of FEC encoded bits,
wherein:
a parity check matrix of the first FEC code has a first average information bit node degree, and a parity check matrix of the second FEC code has a second average information bit node degree, and
the first optimized FEC code has an FEC rate, and the second optimized FEC code has the FEC rate.

12. The method of claim 11, wherein:
receiving the FEC code optimization information includes receiving an information indicating a target average number of interfering users, the first value indicating a first target average number, and the second value indicating a second target average number, and
selecting between at least the first optimized FEC code and the second optimized FEC code is based, at least in part, on a product of the FEC rate and the target average number of users.

13. The method of claim 12, wherein:
the parity check matrix of the first optimized FEC code has a first constant information bit node degree, the first constant information bit node degree being the first average information bit node degree, and
the parity check matrix of the second optimized FEC code has a second constant information bit node degree, the second constant information bit node degree being the second average information bit node degree.

14. The method of claim 13, wherein
the selected FEC code has a constant information bit node degree of 2 when the product of the FEC code rate and the target average number of users is 0.9 or higher.

15. The method of claim 12, wherein the method further includes:
detecting an average number of interfering users, and
upon the product of the detected average number of interfering users and the FEC code rate being within the first range, automatically selecting the first optimized FEC code,
upon the product of the detected average number of interfering users and the FEC code rate being within the second range, automatically selecting the second optimized FEC code.

16. The method of claim 12, wherein,
selecting the first optimized FEC code is based, at least in part, on the product of the FEC rate and the target average number of users being within a first range,
selecting the second optimized FEC code is based, at least in part, on the product of the FEC rate and the target average number of users being within a second range, and
a relation of the product of the target average number of users and the FEC code rate to the first range and to the second range is according to the table below, where $\lambda$ is the target average number of interfering users, R is the FEC code rate and R is equal to 1/6:

| Range ($R \times \lambda$) | Optimized FEC Code | Information Bit Node Degree of Optimized FEC Code |
|---|---|---|
| First, less than 0.6 | First Optimized FEC Code | 3 |
| Second, greater or equal to 0.6 | Second Optimized FEC Code. | 2 |

17. The method of claim 12, wherein the FEC code optimization information is further switchable between at least the first value, the second value and a third value, and wherein the method further includes:
selecting a third optimized FEC code, based at least in part on a product of the FEC code rate and the target average number of users being within a third range, and
a relation of the product of the target average number of users and the FEC code rate to the first range, the second range, and the third range is according to the table below, where $\lambda$ is the target average number of interfering users, R is the FEC code rate and R is equal to 1/8:

| Range ($R \times \lambda$) | Optimized FEC Code | Information Bit Node Degree of Optimized FEC Code |
|---|---|---|
| First, less than 0.3 | First Optimized FEC Code | 4 |
| Second, between 0.3 and 0.7 | Second Optimized FEC Code | 3 |
| Third, more than 0.7 | Third Optimized FEC Code. | 2 |

18. The method of claim 12, wherein the FEC code optimization information is further switchable between at least the first value, the second value and a third value, and wherein the method further includes:
selecting a third optimized FEC code, based at least in part on a product of the FEC code rate and the target average number of users being within a third range, and
a relation of the product of the target average number of users and the FEC code rate to the first range, the second range, and the third range is according to the table below, where $\lambda$ is the target average number of interfering users, R is the FEC code rate and R is equal to 1/9:

| Range ($R \times \lambda$) | Optimized FEC Code | Information Bit Node Degree of Optimized FEC Code |
|---|---|---|
| First, less than 0.3 | First Optimized FEC Code | 4 |
| Second, between 0.3 and 0.8 | Second Optimized FEC Code | 3 |
| Third, more than 0.8 | Third Optimized FEC Code. | 2 |

19. The method of claim 12, wherein the FEC code optimization information is further switchable between at least the first value, the second value and a third value, and wherein the method further includes:
selecting a third optimized FEC code, based at least in part on a product of the FEC code rate and the target average number of users being within a third range, and
a relation of the product of the target average number of users and the FEC code rate to the first range, the second range, and the third range is according to the table below, where $\lambda$ is the target average number of interfering users, R is the FEC code rate and R is equal to 1/15:

| Range ($R \times \lambda$) | Optimized FEC Code | Information Bit Node Degree of Optimized FEC Code |
|---|---|---|
| First, less than 0.5 | First Optimized FEC Code | 4 |
| Second, between 0.5 and 0.9 | Second Optimized FEC Code | 3 |
| Third, more than 0.9 | Third Optimized FEC Code. | 2 |

20. The method of claim 12, wherein the FEC code optimization information is further switchable between at least the first value, the second value and a third value, and wherein the method further includes:
  selecting a third optimized FEC code, based at least in part on a product of the FEC code rate and the target average number of users being within a third range, and
  a relation of the product of the target average number of users and the FEC code rate to the first range, the second range, and the third range is according to the table below, where $\lambda$ is the target average number of interfering users, R is the FEC code rate and R is equal to 1/16:

| Range ($R \times \lambda$) | Optimized FEC Code | Information Bit Node Degree of Optimized FEC Code |
|---|---|---|
| less than 0.55 | First Optimized FEC Code | 4 |
| between 0.55 and 0.9 | Second Optimized FEC Code | 3 |
| more than 0.9 | Third Optimized FEC Code. | 2 |

* * * * *